(12) United States Patent
Asahara et al.

(10) Patent No.: US 8,950,356 B2
(45) Date of Patent: Feb. 10, 2015

(54) BARRIER-FILM FORMING APPARATUS, BARRIER-FILM FORMING METHOD, AND BARRIER-FILM COATED CONTAINER

(75) Inventors: Yuji Asahara, Kanawaga (JP); Hideo Yamakoshi, Kanawaga (JP); Minoru Danno, Kanawaga (JP); Seiji Goto, Aichi (JP); Akira Shirakura, Tokyo (JP); Masaki Nakaya, Tokyo (JP); Kiyoshi Hiroya, Aichi (JP)

(73) Assignees: Mitsubishi Heavy Industries Food & Machinery Co., Ltd., Aichi (JP); Kirin Beer Kabushiki Kaisha, Tokyo (JP)

( * ) Notice: Subject to any disclaimer, the term of this patent is extended or adjusted under 35 U.S.C. 154(b) by 787 days.

(21) Appl. No.: 12/524,784

(22) PCT Filed: Nov. 22, 2007

(86) PCT No.: PCT/JP2007/072619
§ 371 (c)(1),
(2), (4) Date: Jul. 28, 2009

(87) PCT Pub. No.: WO2008/114475
PCT Pub. Date: Sep. 25, 2008

(65) Prior Publication Data
US 2010/0096393 A1   Apr. 22, 2010

(30) Foreign Application Priority Data

Mar. 16, 2007   (JP) ................................. 2007-069462

(51) Int. Cl.
*C23C 16/00*   (2006.01)
*H05H 1/24*   (2006.01)
(Continued)

(52) U.S. Cl.
CPC ................. *H05H 1/24* (2013.01); *B65D 23/02* (2013.01); *C23C 16/045* (2013.01); *C23C 16/509* (2013.01); *H01J 37/32348* (2013.01); *H01J 37/32623* (2013.01)
USPC .................................................... 118/723 E

(58) Field of Classification Search
USPC .......................... 118/715, 722, 723 R, 723 E; 156/345.43–345.47; 315/111.21
See application file for complete search history.

(56) References Cited

U.S. PATENT DOCUMENTS 5,798,139 A * 8/1998 Nagashima et al. .......... 427/237
6,112,695 A * 9/2000 Felts .......................... 118/723 E
(Continued)

FOREIGN PATENT DOCUMENTS

AU   2007349770   9/2008
CN   1697763   11/2005
(Continued)

OTHER PUBLICATIONS

English Machine Translation of JP 2003-293135, obtained from http://www19.ipdl.inpit.go.jp/PA1/cgi-bin/PA1DETAIL on Jan. 24, 2012.*

(Continued)

*Primary Examiner* — Maureen Gramaglia
(74) *Attorney, Agent, or Firm* — Wenderoth, Lind & Ponack, L.L.P.

(57) ABSTRACT

A barrier-film forming apparatus that forms a barrier film on an inner face of a container having a concave or convex portion as a processing target, including: a dielectric member having a cavity sized to enclose the container, an external electrode covering an outer circumference of the dielectric member, an exhaust unit installed on an end face of the external electrode on a side where a mouth of the container is located, with an insulating member interposed therebetween, and depressurizing inside of the container through an exhaust pipe, an internal electrode inserted from a side of the exhaust pipe and also serving as a gas blowout unit that blows out medium gas for generating a barrier film into the container, and an electric-field applying unit that applies an electric field for generating exhaust between the external electrode and a ground electrode.

69 Claims, 36 Drawing Sheets

(51) Int. Cl.
- *B65D 23/02* (2006.01)
- *C23C 16/04* (2006.01)
- *C23C 16/509* (2006.01)
- *H01J 37/32* (2006.01)

(56) References Cited

U.S. PATENT DOCUMENTS

| | | |
|---|---|---|
| 6,565,791 B1 | 5/2003 | Laurent |
| 2005/0118365 A1 | 6/2005 | Miyazaki et al. |

FOREIGN PATENT DOCUMENTS

| | | |
|---|---|---|
| JP | 08-053116 | 2/1996 |
| JP | 2788412 | 2/1996 |
| JP | 2000-230064 | 8/2000 |
| JP | 3643813 | 8/2003 |
| JP | 2003-286571 | 10/2003 |
| JP | 2003-293135 | 10/2003 |
| JP | 2003-321056 | 11/2003 |
| JP | 2005-194606 | 7/2005 |
| JP | 2005-247431 | 9/2005 |
| RU | 2 199 792 | 3/2002 |
| RU | 2 189 401 | 9/2002 |
| RU | 2 338 006 | 12/2004 |
| WO | 03/053801 | 7/2003 |
| WO | 03/101847 | 12/2003 |

OTHER PUBLICATIONS

Office Action issued Oct. 21, 2011 in corresponding Australian Application No. 2007349770.
International Search Report mailed Feb. 26, 2008 for International Application No. PCT/JP2007/072619.
Chinese Office Action issued Aug. 23, 2010 in corresponding Chinese Patent Application No. 200780052199.0 w/English translation.
Russian Patent Office Action dated Dec. 8, 2010 in corresponding Russian Patent Application No. 2009138244 with English translation.
Chinese Notice of Allowance issued Jul. 17, 2012 in corresponding Chinese Application No. 200780052199.0.
Korean Notice of Allowance issued Jun. 26, 2012 in corresponding Korean Application No. 2009-7019253.
Office Action mailed Oct. 11, 2012 in corresponding Philippine Application No. 1-2009-501448.
Japanese Notice of Allowance issued Aug. 27, 2013 in corresponding Japanese Patent Application No. 2007-069462 with partial English translation.

\* cited by examiner

FIG.9
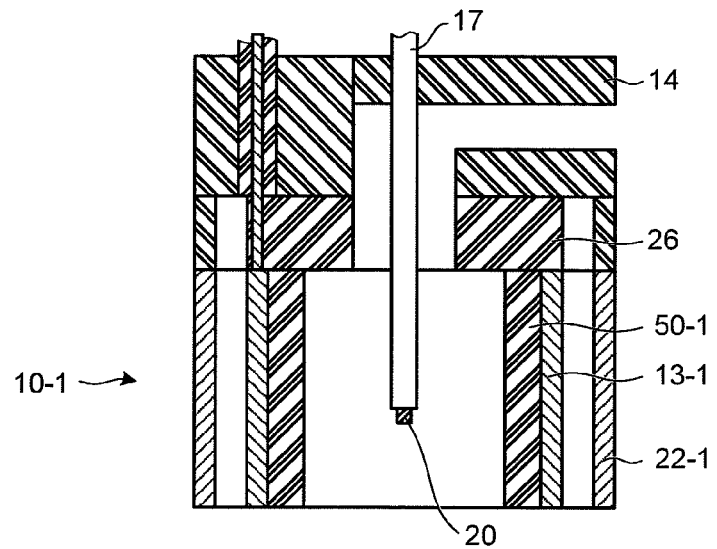
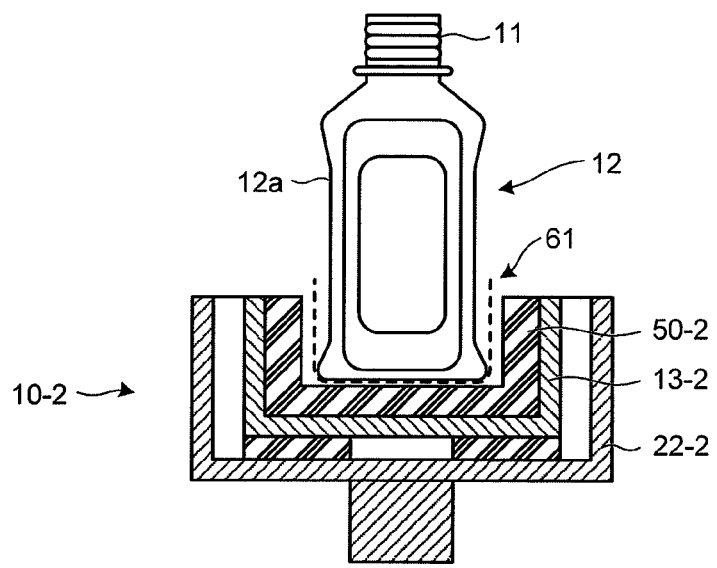

BARRIER-FILM FORMING APPARATUS, BARRIER-FILM FORMING METHOD, AND BARRIER-FILM COATED CONTAINER

BACKGROUND OF THE INVENTION

I. Technical Field.

The present invention relates to a barrier-film forming apparatus, a barrier-film forming method, and a barrier-film coated container for uniformly forming a barrier film that provides a gas barrier property to a resin container, for example.

II. Description of the Related Art

Recently, an approach has been adopted to coat an inner face of a polyethylene terephthalate (PET) bottle, which is one type of plastic containers, with a film having a high barrier property, for example a carbon film such as diamond-like carbon (DLC) or a silica film, to prevent transmission of external oxygen or transmission of internal carbon dioxide (for example, from carbonated beverage). Various film depositing apparatuses for that purpose are proposed (Japanese Patent Application Laid-open No. H8-53116, Japanese Patent No. 2788412 (Japanese Patent Application Laid-open No. H8-53117), WO2003/101847, Japanese Patent No. 3643813 (Japanese Patent Application Laid-open No. 2003-237754), Japanese Patent Application Laid-open No. 2005-247431 and Japanese Patent Application Laid-open No. 2000-230064). Applications of this approach are used for medical containers, food containers, and fuel tanks to prevent transmission of oxygen, hydrogen, and fuel, or transmission or absorption of aroma, and the like.

As a film forming apparatus that forms a carbon film on a plastic container using high-frequency plasma chemical vapor deposition (CVD), an apparatus according to Japanese Patent No. 3643813 (Japanese Patent Application Laid-open No. 2003-237754), which is a basic invention that achieves coating of inside of a container, will be explained with reference to FIG. 38.

As shown in FIG. 38, a barrier-film forming apparatus forms a film on an inner face of a plastic container 12 having a mouth 11 by discharge plasma. This barrier-film forming apparatus includes an external electrode 13 including an upper external electrode 13-1 and an lower external electrode 13-2 and having a size to enclose an outer circumference of the plastic container 12, and a spacer 25 including a dielectric that is interposed at least between the mouth and a shoulder of the container and the external electrode 13 when the plastic container 12 is inserted therein. The barrier-film forming apparatus further includes an exhaust pipe 14 attached to an end face of the external electrode 13 on the side where the mouth 11 is located, with an insulating member 26 interposed therebetween, and an internal electrode 17 that is inserted into the plastic container from the side of the exhaust pipe 14 into the plastic container 12 within the external electrode 13 to be connected to a ground side and has a gas flow channel 16 drilled to blow out medium gas 19. The barrier-film forming apparatus further includes an exhaust unit (not shown) attached to the exhaust pipe 14, a gas supplier (not shown) that supplies the medium gas 19 to the internal electrode 17, and a high-frequency power source 18 connected to the external electrode 13. Reference numeral 20 denotes a gas blowout hole made of an insulating member mounted at a tip of the gas flow channel 16.

The external electrode 13 is installed in a cylindrical earth shield 22 having flanges 21a and 21b at upper and lower ends, respectively. The cylindrical earth shield 22 is mounted on an annular base 23. A disk insulating plate 24 is placed between the annular base 23 and the bottom of the external lower electrode 13-2. The cylindrical insulating member 26 is provided at the tip of the gas flow channel 16 of the internal electrode 17 to prevent local concentration of plasma.

The spacer 25 is fixed by a screw (not shown) threaded therein from the annular insulating member 26 placed on the spacer 25. By inserting and fixing the spacer 25 to an upper part of the external electrode 13 in this way, the mouth and the shoulder of the plastic container 12 are positioned in a cavity of the disk spacer 25, and the outer circumference of the plastic container 12 except for the mouth and the shoulder is positioned at the inner face of the external electrode 13, when the plastic container 12 is inserted from the bottom of the external electrode 13. The gas exhaust pipe 14 having upper and lower flanges 31a and 31b is placed on the upper flange 21a of the earth shield 22 and an upper surface of the annular insulating member 26. A cover 32 is attached to the upper flange 31a of the exhaust pipe 14.

A method of coating the plastic container with a carbon film using the apparatus with the configuration as described above will be explained.

The plastic container 12 is first inserted into the external electrode 13, and internal gas is evacuated through the exhaust pipe 14. When a prescribed vacuum is obtained (typical value: $10^{-1}$ to $10^{-5}$ Torr), medium gas G is supplied to the internal electrode 17 at a flow rate of 10 to 200 mL/min, for example, and blown out into the plastic container 12 through the gas blowout hole 20 of the internal electrode 17, while the evacuation is continued. As the medium gas, an aliphatic hydrocarbon, an aromatic hydrocarbon, an oxygenated hydrocarbon, or a nitrogenous hydrocarbon, such as benzene, toluene, xylene, and cyclohexane is used. A pressure in the plastic container 12 is set at $2\times10^{-1}$ to $1\times10^{-2}$ Torr, for example, depending on balance between an amount of the gas supplied and an amount of air evacuated. The high-frequency power source 18 then applies high-frequency power of 50 to 2000 watts to the external electrode 13 through a matching box 36 and a radio-frequency (RF) input terminal 35.

The application of the high-frequency power to the external electrode 13 generates plasma between the external electrode 13 and the internal electrode 17. At this time, the plastic container 12 is housed within the external electrode 13 with almost no space therebetween, and thus the plasma is generated in the plastic container 12. The medium gas G is dissociated or further ionized by the plasma, and then a film-forming seed for forming a carbon film is generated. This film-forming seed is deposited on the inner face of the plastic container 12, thereby forming a carbon film. When a predetermined thickness of the carbon film is formed, the application of the high-frequency power is stopped, the supply of the medium gas is stopped, the remaining gas is evacuated, and nitrogen, noble gas, or air is supplied within the external electrode 13 to bring the space back to the atmospheric pressure. The plastic container 12 is then removed from the external electrode 13. This method takes two to three seconds to form a carbon film of a thickness of 20 to 30 nanometers.

SUMMARY OF INVENTION

However, in this film forming apparatus (Japanese Patent No. 3643813 (Japanese Patent Application Laid-open No. 2003-237754)), the shape of the hollow space formed by the external electrode 13 and the spacer 25 needs to be approximately similar to the shape of the plastic container 12 to form a satisfactory film having a high barrier property.

While there is no spacer in Japanese Patent Application Laid-open No. H8-53116 and Japanese Patent No. 2788412

(Japanese Patent Application Laid-open No. H8-53117), the shape of a cavity of an external electrode also needs to be approximately similar to the shape of a plastic container. In each case, when the container has concave and convex portions (either one of the concave portion and the convex portion, or both thereof) at its body or the like, the shape of the cavity naturally needs to be similar to the shape of the container. However, when the apparatus has a configuration in which the container is inserted longitudinally, it is difficult to realize such a similar shape.

When the body of the container has relatively few concave and convex portions, a barrier property for practical use can be just obtained even when a slight space is formed at the concave and convex portions. However, because of recent diversification of containers like those seen in container designs for the purpose of reduction in weight and facilitation in crushing after use, bodies of some containers have plural concave and convex portions (or recessed portions, concave portions, or convex portions), or some of the recessed portions (concave portions) are deep. In such cases, nonuniformity of the formed film is greatly increased, and therefore the barrier property for practical use cannot be obtained.

A method is conceived of a moving part of the external electrode to be adapted to concave and convex portions of a container after the container is inserted into the external electrode, thereby obtaining a similar shape. However, such a movable structure needs to be avoided in a high-speed mass production apparatus as much as possible in view of cost and reliability.

Even when there is no concave or convex and a similar shape can be realized, an electrode completely similar to a container needs to be used, and a clearance therebetween needs to be uniform to obtain a higher barrier property. However, it is difficult to realize this because of accuracy in molding of the container, accuracy in production of the external electrode 13 or the spacer 25, or accuracy in installation of the container. Therefore, the higher barrier property cannot be obtained.

In the conventional techniques, there is a proposition (WO2003/101847) that provides an adequate clearance between an external electrode and a container. However, when the container has concaves and convexes, it is necessary to adjust the shape of the clearance from an approximately similar shape to be suited to the concave and convex portions of the container, thereby obtaining a shape that enables the container to be inserted into the clearance and have a high barrier property. Therefore, it is necessary to produce the external electrodes almost entirely to order to be adapted to diversified shapes of the containers, which increases costs and labors. The weight of the external electrode is easily increased, and thus arrangement of the external electrode or setting of a movable portion in the configuration of the apparatus is prone to be limited. Therefore, some trouble is caused in an apparatus that forms a film while a container is transported being inverted, for example.

In the conventional techniques, there is another proposition (Japanese Patent No. 3643813 (Japanese Patent Application Laid-open No. 2003-237754)) of a film forming apparatus having a dielectric spacer mainly at positions of the mouth and shoulder of a container. In another proposition (Japanese Patent Application Laid-open No. 2005-247431), the dielectric spacer is extended to a lower portion of a container. These propositions are made to adjust film attachment to a small diameter part at the shoulder of a container having no concave and convex at its body, to which an electrode or a spacer having a similar shape can be applied. Accordingly, when the container has concaves and convexes at its body, entire uniformity including film attachment to the body of the container cannot be achieved. That is, no guideline is provided for improvement in uniformity of film distribution, which becomes an issue when a film is formed on a container having concaves and convexes at its body and the like. This is because voltage to be applied to an inner face of a container, which will be explained later, is not uniformized.

In the conventional techniques, there is another proposition (Japanese Patent Application Laid-open No. 2000-230064) of a film forming apparatus having a plastic external cylinder between an electrode and a film formation target. This plastic external cylinder electrically contacts the electrode and is a certain distance separated from the film formation target. This proposition provides no guideline for improvement in uniformity of film distribution either, which becomes the issue in film formation for a container having concaves and convexes at its body and the like. This is also because voltage applied to the inner face of the container, which will be explained later, is not uniformized. The invention according to Japanese Patent Application Laid-open No. 2000-230064 is applied to a film forming apparatus that forms a film on both of inner and outer faces of the container. A primary object thereof is to prevent heat application to the container, and no guideline is provided for improvement in film distribution in film formation only on the inner face.

To sum up, the problems are organized as follows. To form a high-quality gas barrier thin film, voltage to be applied to the inner face of the container, which will be explained later, needs to be uniformized. When an approach from a viewpoint of a structure of the external electrode is adopted, a combination of a space and a dielectric having appropriate size and composition is provided between the external electrode and the container, thereby optimizing voltage distribution. As described above, there is no conventional technique that achieves such a combination. If this combination can be achieved, various issues other than a high gas barrier property, specifically including sharing of the external electrode with various types of containers, handling of concave and convex designs of containers, uniform distribution of film thickness, and reduction in weight of the external electrode can be resolved. Therefore, significant effects can be achieved in terms of quality and device cost.

The present invention has been achieved to solve the problems above mentioned, and an object of the present invention is to provide a barrier-film forming apparatus, a barrier-film forming method, and a barrier-film coated container capable of forming a uniform film on a container having concave and convex surfaces.

According to an aspect of the present invention, in a barrier-film forming apparatus that forms a barrier film on an inner face of a container, voltage to be applied to the inner face of the container is made approximately uniform by using: a dielectric member installed between an external electrode and the container; and a clearance between the external electrode and the container, or a clearance between the dielectric member and the inner face of the container.

Advantageously, in the barrier-film forming apparatus, an internal shape of the external electrode is tubular or approximately tubular.

According to another aspect of the present invention, a barrier-film forming apparatus that forms a barrier film on an inner face of a container having at least one concave or convex portion as a processing target container includes: a dielectric member that has a cavity sized to enclose the container; an external electrode that covers an outer circumference of the dielectric member; an exhaust unit that is installed on an end face of the external electrode on a side where a mouth of the container is located, with an insulating member interposed therebetween, and depressurizes inside of the container through an exhaust pipe; a gas blowout unit that blows out medium gas for generating a barrier film, into the container; and an electric-field applying unit that applies an electric field for generating discharge between the external electrode and a ground electrode.

Advantageously, in the barrier-film forming apparatus, the gas blowout unit is grounded, and inserted into the container to serve as an internal electrode.

Advantageously, in the barrier-film forming apparatus, the cavity sized to enclose the processing target container matches a space formed by a maximum path line on which the outer circumference of the container passes, or has a clearance outside the space.

Advantageously, in the barrier-film forming apparatus, the dielectric member has a tubular shape having a bottom or a tubular shape substantially having a bottom.

Advantageously, in the barrier-film forming apparatus, the dielectric member has a bottomless tubular shape or a tubular shape having a portion of bottom.

Advantageously, in the barrier-film forming apparatus, a part of the external electrode, which faces a space at the concave portion of the container, is covered with the dielectric member.

Advantageously, in the barrier-film forming apparatus, a part of the cavity of the dielectric member, or approximately the entire of the cavity is substantially in contact with the container.

Advantageously, in the barrier-film forming apparatus, the dielectric member is any one of fluorinated resin, hard vinyl chloride, glass, and ceramic, or a combination thereof.

Advantageously, in the barrier-film forming apparatus, a clearance between a body of the container and the dielectric member formed when the container is placed inside of the dielectric member is designed so that a difference between a maximum value and a minimum value of a width of the clearance is equal to or larger than 3 millimeters.

Advantageously, in the barrier-film forming apparatus, the dielectric member has an approximately uniform thickness.

Advantageously, in the barrier-film forming apparatus, the dielectric member has a tubular shape or an approximately tubular shape with a bottom or without bottom, and an average thickness/a permittivity of the dielectric member is in a range of 0.95 to 3.8.

Advantageously, in the barrier-film forming apparatus, the dielectric member has a clearance at any one of a shoulder and a mouth of the container, or both thereof.

Advantageously, in the barrier-film forming apparatus, a sum of converted distances $d_i/\in_i$ obtained by dividing a thickness ($d_i$) of the dielectric member or a space by a relative permittivity ($\in_i$) from an inner surface of the external electrode to the inner face of the container is approximately uniform over the entire container.

Advantageously, in the barrier-film forming apparatus, a material of the dielectric member, thicknesses of the dielectric member and the space, and a shape of the external electrode are combined to make a sum of the converted distances $d_i/\in_i$ from an inner surface of the external electrode to the inner face of the container approximately uniform over substantially the entire container.

Advantageously, in the barrier-film forming apparatus, with respect to a sum of converted distances $d_i/\in_i$ obtained by dividing a thickness ($d_i$) of the dielectric member or a space by a relative permittivity ($\in_i$) at each point of the container surface on a cross section of the container from an inner surface of the external electrode to the inner face of the container, a value obtained by dividing a standard deviation of the sum at each point of the entire container by an average thereof is equal to or lower than 0.75.

According to still another aspect of the present invention, a barrier-film forming apparatus includes: a dielectric member having a cavity sized to enclose at least a primary portion of a container as a processing target, which cavity matches a space formed by a maximum path line on which an outer circumference of the container passes, or has a clearance outside the space; an external electrode installed on a side of an outer circumference of the dielectric member; an exhaust unit that depressurizes inside of the container through an exhaust pipe; a gas blowout unit that blows out medium gas for generating a barrier film, into the container; and an electric-field applying unit connected to the external electrode to generate discharge in the container, and forming a barrier film on an inner face of the container.

Advantageously, in the barrier-film forming apparatus, the external electrode is a ground electrode, and an electrode connected with the electric-field applying unit is installed in the container or to the exhaust pipe.

Advantageously, in the barrier-film forming apparatus, a part of the dielectric member is in contact with the container, thereby positioning the container.

Advantageously, in the barrier-film forming apparatus, a part of the dielectric member is in contact with the container, thereby positioning the container, the part of the dielectric in contact with the container has a movable structure; and the movable structure is moved when the container is inserted or removed.

Advantageously, in the barrier-film forming apparatus, a conductive earth shield sized to enclose the external electrode and being grounded is installed to be insulated from the external electrode.

Advantageously, in the barrier-film forming apparatus, the external electrode also serves as a vacuum container.

Advantageously, in the barrier-film forming apparatus, the dielectric member also serves as a vacuum container.

Advantageously, in the barrier-film forming apparatus, a conductive earth shield sized to enclose the external electrode and being grounded is installed to be insulated from the external electrode, and the earth shield also serves as a vacuum container.

Advantageously, in the barrier-film forming apparatus, the external electrode also serves as a vacuum container, and the external electrode is in form of a sheet.

Advantageously, in the barrier-film forming apparatus, a conductive earth shield sized to enclose the external electrode and being grounded is installed to insulated from the external electrode, and an insulating member is installed substantially entirely between the external electrode and the earth shield.

Advantageously, in the barrier-film forming apparatus, the container as the processing target has an approximately tubular shape.

Advantageously, in the barrier-film forming apparatus, the container as the processing target has an approximately tubular shape and has at least one concave portion.

According to still another aspect of the present invention, a barrier-film forming method of approximately uniformly forming a barrier film on an inner face of a container as a processing target uses the barrier-film forming apparatus described above.

According to still another aspect of the present invention, a barrier-film forming method approximately uniformly forming a barrier film on an inner face of a container as a processing target uses the barrier-film forming apparatus described above. The container as the processing target has an approximately tubular shape.

According to still another aspect of the present invention, a barrier-film forming method of approximately uniformly forming a barrier film on an inner face of a container as a processing target uses the barrier-film forming apparatus described above. The container as the processing target has an approximately tubular shape and has at least one concave portion.

According to still another aspect of the present invention, a barrier-film forming method of approximately uniformly forming a barrier film on an inner face of a container as a processing target uses the barrier-film forming apparatus described above. Plural dielectric members having various cavity shapes are prepared, one of the dielectric members is selected to be suited to a shape or the like of the container as the processing target, and the barrier film is then formed on the container.

According to still another aspect of the present invention, a barrier-film forming method of approximately uniformly forming a barrier film on an inner face of a container as a processing target uses the barrier-film forming apparatus described above. All or a part of the dielectric member, all or a part of the external electrode, and all or a part of the earth shield are moved together as a unit by a driving unit, and the vacuum container is opened or closed to insert or remove the container.

According to still another aspect of the present invention, in a barrier-film forming method, the barrier-film forming apparatus described above is used, and the container is inserted or removed by neck handling.

Advantageously, in the barrier-film forming apparatus, the dielectric member has an opening through which the container can be inserted from a bottom of the container toward a bottom of the external electrode of a tubular shape with a bottom.

According to still another aspect of the present invention, in a barrier-film forming apparatus that forms a barrier film on an inner face of a container, voltage to be applied to the inner face of the container is made approximately uniform by using: a dielectric member installed between an external electrode and the container; and a clearance between the external electrode and the container, or a clearance between the dielectric member and the inner face of the container, a mouth end portion of the external electrode points downward to orient the container to have a mouth pointing downward, and an exhaust pipe is attached below the end portion of the external electrode, with an insulating member interposed therebetween, thereby forming the barrier film on the inner face of the container.

According to still another aspect of the present invention, a barrier-film forming apparatus that forms a barrier film on an inner face of a container having at least one concave or convex portion as a processing target container, includes: a dielectric member that has a cavity sized to enclose the container; an external electrode that covers an outer circumference of the dielectric member; an exhaust unit that is installed on an end face of the external electrode on a side where a mouth of the container is located, with an insulating member interposed therebetween, and depressurizes inside of the container through an exhaust pipe; a gas blowout unit that blows out medium gas for generating a barrier film, into the container; and an electric-field applying unit that applies an electric field for generating discharge between the external electrode and a ground electrode. A mouth end portion of the external electrode points downward to orient the container to have a mouth pointing downward, and the exhaust pipe is attached below the end portion of the external electrode, with the insulating member interposed therebetween, thereby forming the barrier film on the inner face of the container.

According to still another aspect of the present invention, a barrier-film forming apparatus includes: a dielectric member having a cavity sized to enclose at least a primary portion of a container as a processing target, which cavity matches a space formed by a maximum pass line on which an outer circumference of the container passes, or has a clearance outside the space; an external electrode installed on a side of an outer circumference of the dielectric member; an exhaust unit that depressurizes inside of the container through an exhaust pipe; a gas blowout unit that blows out medium gas for generating a barrier film, into the container; and an electric-field applying unit connected to the external electrode to generate discharge in the container. A mouth end portion of the external electrode points downward to orient the container to have a mouth pointing downward, and the exhaust pipe is attached below the end portion of the external electrode, with an insulating member interposed therebetween, thereby forming a barrier film on an inner face of the container.

According to still another aspect of the present invention, in a barrier-film forming method of using the barrier-film forming apparatus described above, the container is vertically inverted, and insertion or removal of the container into or from the external electrode is then performed by neck handling.

According to still another aspect of the present invention, a barrier-film coated container is obtained by approximately uniformly forming a barrier film on an inner face of a container as a processing target by using the barrier-film forming apparatus described above.

According to still another aspect of the present invention, a barrier-film coated container is obtained by using the barrier-film forming apparatus described above. The container is vertically inverted, and insertion or removal of the container into or from the external electrode is then performed by neck handling, thereby forming a barrier film on an inner face of the container as a processing target.

According to the present invention, the voltage to be applied to the entire inner face of the container can be uniformized by using the dielectric member installed between the external electrode and the container, and the clearance between the dielectric member and the container. Therefore, a barrier film formed on the inner face of the container can be entirely made uniform, thereby producing the container with a high barrier property.

BRIEF DESCRIPTION OF THE DRAWINGS

FIG. 9 is a process chart of forming a film on an inner face of a container using the barrier-film forming apparatus.

DETAILED DESCRIPTION OF THE INVENTION

The present invention is explained below in detail with reference to the accompanying drawings. The invention is not limited to the embodiments. In addition, constituent elements in the following embodiments include elements that readily occur to those skilled in the art or substantially equivalent elements.

[First Embodiment]

A barrier-film forming apparatus according to a first embodiment of the present invention will be explained with reference to the accompanying drawings.

Figure 1:
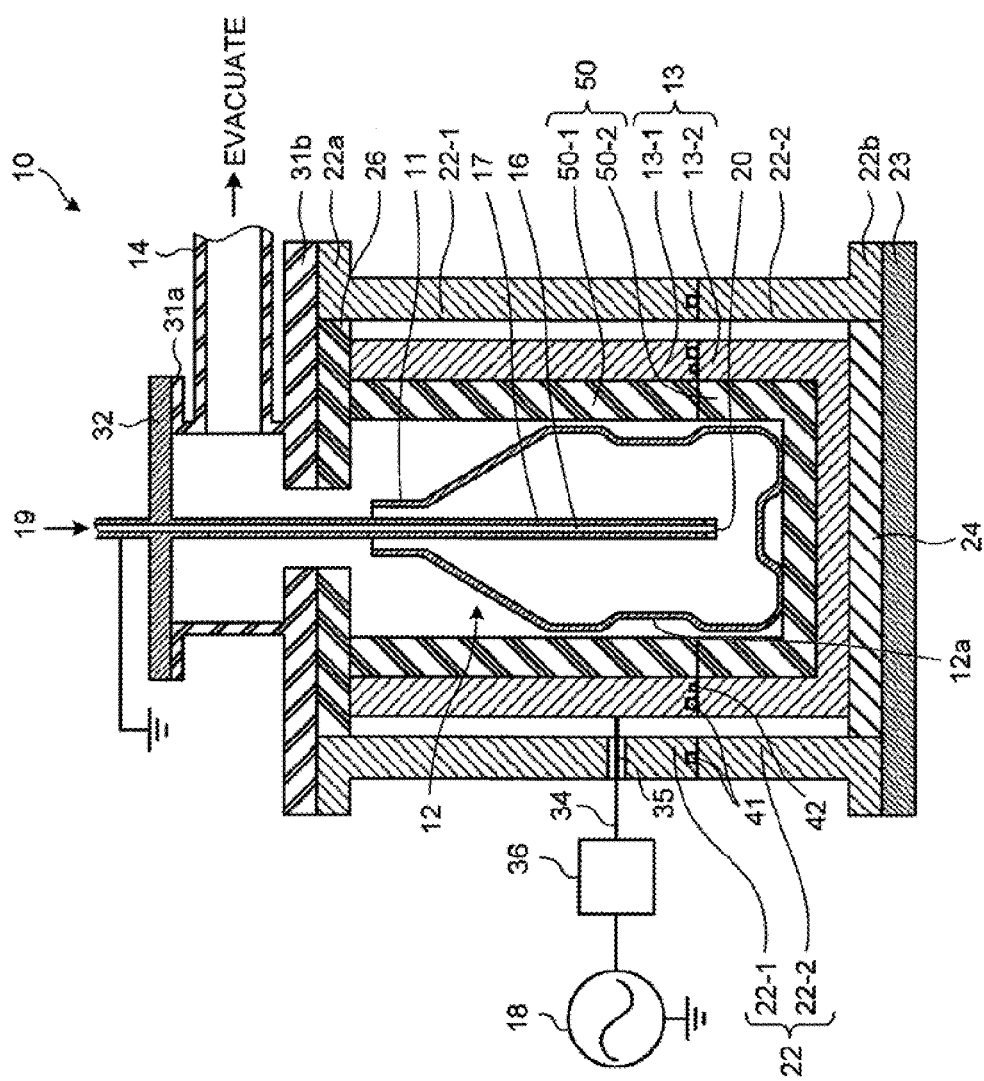
FIG. 1 is a schematic diagram of a barrier-film forming apparatus according to a first embodiment of the present invention.
Figure 38:
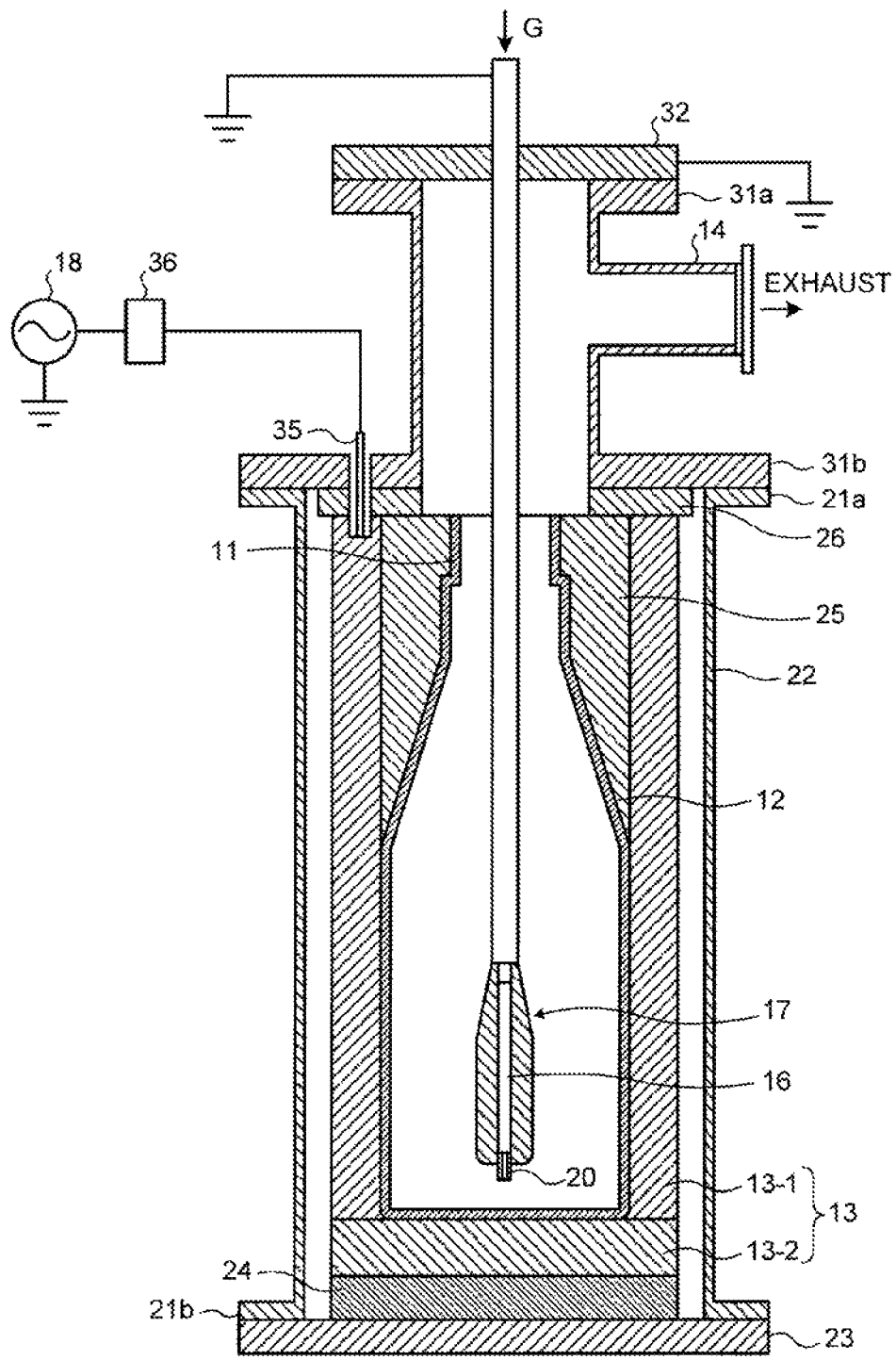
FIG. 38 is a schematic diagram of a barrier-film forming apparatus according to a conventional technique.

FIG. 1 is a conceptual diagram of the barrier-film forming apparatus according to the present embodiment. The same members as those in the barrier-film forming apparatus according to the conventional technique explained with reference to FIG. 38 are denoted by like reference numerals and redundant explanations thereof will be omitted.

As shown in FIG. 1, a barrier-film forming apparatus 10 according to the present embodiment forms a barrier film on an inner face of a processing target, which is the plastic container (hereinafter, also "container") 12 having at least one concave or convex portion 12a. The barrier-film forming apparatus 10 includes a dielectric member 50 that has a cavity sized to enclose at least a major portion of the container 12, the external electrode 13 that covers an outer circumference of the dielectric member 50, and an exhaust unit (not shown) that is attached to an end face of the external electrode 13 on a side where the mouth 11 of the container 12 is located, with the insulating member 26 interposed therebetween, to depressurize the inside of the container 12 through the exhaust pipe 14. The barrier-film forming apparatus 10 further includes the internal electrode 17 that is inserted from the side of the exhaust pipe 14 and serves also as a gas blowout unit for blowing out the medium gas 19 for forming a barrier film into the container 12, and an electric-field applying unit (the high-frequency power source 18 and the matching box 36) that applies an electric field to generate discharge between the external electrode 13 and a ground electrode.

According to the present invention, voltage to be applied to the inner face of the container 12 is made approximately uniform in relation of relative permittivity $\in_i$ inherent in the dielectric member by using the dielectric member 50 installed between the external electrode 13 and the container 12, and a clearance between the dielectric member 50 and the container 12. In this way, a uniform film can be formed on the inner face of the container. Details thereof will be explained later. The present invention has been achieved because it is found that approximation using the clearance size and the relative permittivity as described above can be utilized in a practical electrode design, instead of aiming at uniformity in potential in a narrow sense.

Further, while the external electrode 13 has a cylindrical shape in the present embodiment, the present invention is not limited thereto. For example, the external electrode 13 can have a prism tubular shape or include a constricted part to be adapted to the shape of the container to be applied. The dielectric member 50 encloses the major portion of the container 12, which indicates a body of the container, for example. It indicates that the dielectric member 50 encloses a portion constituting about more than half of the container surface area, for example, instead of enclosing only subsidiary portions such as the mouth and the shoulder of the container. While it is assumed that the dielectric member 50 encloses substantially the entire container, cases are assumed in which the major portion does not include special portions such as the bottom and a handle of the container, and a portion for which the film thickness is to be specially adjusted, which is defined as "enclosing the major portion".

The external electrode 13 is installed in the earth shield 22 in a tubular shape including an earth shield (upper) 22-1 and an earth shield (lower) 22-2 having flanges 22a and 22b at upper and lower ends thereof.

The tubular earth shield 22 (the earth shield (upper) 22-1 and the earth shield (lower) 22-2), the external electrode 13 (the external electrode (upper) 13-1 and the external electrode (lower) 13-2), and the dielectric member 50 (a dielectric member (upper) 50-1 and a dielectric member (lower) 50-2) can be divided into two, i.e., upper and lower portions, and are removably attached to each other. The disk insulating plate 24 is located between the annular base 23 and the bottom of the external electrode (lower) 13-2.

The exhaust pipe 14 having the upper and lower flanges 31a and 31b is formed, and the earth shield 22-1 is hung from the lower flange 31b through the upper flange 22a. The cover 32 is attached to the upper flange 31a of the exhaust pipe 14.

The tubular earth shield 22 is made of a conductive material (conductive member such as aluminum, stainless steel, copper, and brass), and serves both as an electromagnetic shield for preventing electromagnetic radiation and as a high-frequency earth. The earth shield 22 can be made of a solid material, a mesh, a perforated metal, or the like. The earth shield 22 has the tubular shape, such as a cylindrical shape and a prism, and encloses the entire electrode.

Conductive connectors 41 and vacuum seals (O-rings) 42 are interposed at the divided portions of the tubular earth shield 22 and the external electrode 13, as shown in FIG. 1. The conductive connectors 41 are not always required when high-frequency conduction is ensured.

The dielectric member (lower) 50-2, the external electrode (lower) 13-2, the insulating plate 24, and the annular base 23 are vertically moved as a unit by a pusher (not shown) with respect to the dielectric member (upper) 50-1 and the external electrode (upper) 13-1, thereby opening and closing the bottom of the external electrode (upper) 13-1. The earth shield (lower) 22-2 is divided together with the annular base 23.

In the present embodiment, the internal electrode 17 as a ground electrode also serves as a gas blowout unit. However, the present invention is not limited thereto, and the ground electrode and the gas blowout unit can be provided separately. It is also possible that no internal electrode serving as the ground electrode is provided and that the exhaust pipe is used as the ground electrode. It is also possible that the external electrode serves as the ground electrode and that a power source is connected to the internal electrode, the exhaust pipe, and the like. In sum, it is necessary that that an electric field be applied between the external electrode enclosing the container and the dielectric member, and another electrode (or other electrodes) to generate plasma in the container.

The gas blowout unit is inserted into the container from the side of the exhaust pipe. However, the gas blowout unit does not always need to be inserted in the container, and it is only necessary that the medium gas be supplied inside of the container. Further, it is unnecessary that the gas blowout unit is inserted into the container from the side of the exhaust pipe. When the container has two mouths, for example, the gas can be supplied through one of the mouths, which is not connected to the exhaust pipe, and can be evacuated through the other mouth.

In this embodiment, the high-frequency electric field is used to generate the discharge. However, an alternating electric field, such as an alternate current (AC), a low frequency wave (LF), a radio frequency wave (RF), a very high frequency wave (VHF), a microwave, and a pulse can be used, instead of a direct current. In such an electric field, a current flows through the dielectric member because of a displacement current even when the dielectric member is located between the external electrode and the container. Therefore, the electric field can be transmitted to the inner face of the container, thereby generating plasma. Among those, it is particularly preferable that the present invention be applied to LF, RF, or VHF that can easily form a film of a high barrier property and enables the displacement current to easily flow.

Plastic, glass, or ceramic can be used for the dielectric member 50, for example. It is only necessary to appropriately form the dielectric member using one of these or a combination thereof.

Various types of materials can be used for the plastic. Particularly, resin having a low high-frequency loss, and having a high heat resistance, a high flame resistance, and a high mechanical strength is preferably used. Fluorine resin such as polytetrafluoroethylene, Teflon®, hard vinyl chloride, polycarbonate, PEEK® is preferable. As the ceramic, alumina or steatite having a low high-frequency loss, or Macor® having a high machinability is preferably used.

The high-frequency power source 18 that outputs high frequency power is connected to the external electrode 13 through a cable 34 and the power feeding terminal 35. The matching box 36 is connected to the cable 34 to be interposed between the high-frequency power source 18 and the power feeding terminal 35.

The gas blowout hole 20 in a cylindrical shape made of an insulating member is provided at the tip of the gas flow channel 16 of the internal electrode 17, thereby preventing local concentration of plasma. The gas blowout hole 20 can open in a flow direction to be communicated with the gas flow channel 16 of the internal electrode 17 or of a gas blowout unit that does not serve as the internal electrode, or can be provided on the side wall. The diameter of the internal electrode 17 is equal to or smaller than the inside diameter of the mouth of the plastic container so that the internal electrode 17 can be inserted into the plastic container 12.

The internal electrode 17 is made of a metallic material having a heat resistance, such as tungsten and stainless steel. The internal electrode 17 can be made of aluminum. When the surface of the internal electrode 17 is smooth, there is a possibility that a carbon film deposited on the surface of the internal electrode 17 easily peels. Accordingly, the surface of the internal electrode 17 can be previously sandblasted to increase roughness of the surface, thereby making the carbon film deposited on the surface difficult to peel.

A method of manufacturing a plastic container having an inner face coated with a carbon film using the barrier-film forming apparatus as described above will be explained. The lower portions that are obtained by vertically dividing the dielectric member 50, the external electrode 13, and the earth shield 22 are lowered as a unit by the pusher (not shown) to open inside. The plastic container 12 is then inserted in the opened dielectric member (lower) 50-2, and then the lower portions are moved back by the pusher (not shown) to close. This operation is speeded up by moving the dielectric member (lower) 50-2, the external electrode (lower) 13-2, the insulating plate 24, the annular base 23, and the earth shield (lower) 22-2 together as a unit. At this time, the plastic container 12 is communicated with the exhaust pipe 14 through the mouth.

Gas inside and outside of the exhaust pipe 14 and the plastic container 12 is then evacuated by the exhaust unit (not shown) through the exhaust pipe 14. When a predetermined vacuum is obtained, the medium gas 19 is supplied to the gas flow channel 16 of the internal electrode 17 while the evacuation is continued, and the medium gas 19 is blown out from the gas blowout hole 20 of the internal electrode 17 into the plastic container 12 toward the bottom thereof. The medium gas 19 flows from the bottom of the plastic container 12 along the wall toward the mouth 11. A gas pressure in the plastic container 12 has a predetermined value according to balance between the amount of supplied gas and the amount of evacuated gas. It is not necessary that the predetermined gas pressure be always constant, and the gas pressure can be transiently changed.

The high-frequency power is then supplied from the high-frequency power source 18 to the external electrode 13 through the matching box 36, the cable 34, and the feeding terminal 35. At this time, voltage is applied to the inner face of the plastic container due to the high-frequency voltage applied between the external electrode 13 (substantially to the container inner face) and the grounded internal electrode 17. Discharge plasma is generated in the container due to an electric field generated between a plasma sheath edge and the container inner surface. The medium gas 19 is dissociated due to the discharge plasma, and then a generated film-forming seed is deposited on the inner face of the plastic container 12, thereby forming a carbon film.

When a predetermined film formation time (for example, about one to three seconds) passes, the carbon film has an approximately predetermined thickness. Accordingly, the supply of the high-frequency power from the high-frequency power source 18 is stopped, the supply of the medium gas 19 is stopped, the remaining gas is evacuated, and the evacuation of the gas is stopped. Nitrogen, noble gas, or air is then supplied into the plastic container 12 through the gas blowout hole 20 of the gas flow channel 16 of the internal electrode 17 or through a gas supply valve (not shown) provided on the side of the exhaust pipe, to bring the inside and outside of the plastic container 12 back to the atmospheric pressure. The plastic container having the inner face coated with the carbon film is then removed. The plastic container 12 is then replaced in the order as described above to start a coating operation for another plastic container.

In the present embodiment, acetylene is used as the medium gas 19.

The high-frequency power of 13.56 to 100 megahertz from the high-frequency power source 18 is used to obtain an output of 100 to 1000 watts and a pressure of 0.1 to 1 Torr. The high-frequency power can be applied continuously or intermittently (in a pulse-like manner). The frequency of the high-frequency power to be applied can be set higher (for example, at 60 megahertz) so that a softer carbon film than a DLC film can be synthesized. In this way, adhesion to a base material can be enhanced by a synergistic effect with the soft carbon film resulting from application of nitrogen or oxygen.

In the film formation according to the present invention, the dielectric member 50 is provided to cover the major portion of the container 12 with a predetermined clearance therebetween. Therefore, no plasma concentration occurs, and consequently plasma is generated uniformly, thereby forming a uniform film on the inner face of the container 12 having the concave portion 12a.

That is, in the conventional technique, it is considered that the electrode needs to closely fit the outer face of the container to obtain high barrier. However, in the present invention, the external electrode 13 applied with the high frequency is not made to directly fit the container but the dielectric member 50 is placed substantially over the entire surface of the container 12 to apply the uniform voltage to the substantially entire inner face of the container 12. Accordingly, the substantially entire barrier film formed on the inner face of the container 12 is made homogenous. For example, in the conventional technique, experiences show sufficient improvement of the barrier property is not obtained with a simple tubular electrode when concaves and convexes are at least 3 millimeters or larger. Also in such a case, the present invention can achieve a satisfactory barrier property. The term "uniform" in the present invention indicates relative uniformity as compared to a case to which the present invention is not applied, and is not limited to absolute uniformity.

In the conventional technique, the barrier film has a satisfactory film quality and a larger thickness at a portion where the electrode is in close contact with the container, and a higher barrier property is obtained accordingly. However, the film quality and film thickness are reduced at a portion which the external electrode 13 is separated from the container, which may lower the entire barrier property of the container.

On the other hand, in the present invention, the external electrode 13 has no portion in close contact with the container. Therefore, there is no plasma concentration due to application of voltage to the portion where the external electrode 13 is in close contact, and thus a uniform voltage is applied to the entire container through the dielectric member 50. Accordingly, the plasma is generated uniformly, and consequently the film quality and film thickness of the container become entirely uniform, so that a high barrier property can be obtained in the entire container.

Further, in the conventional technique, when the external electrode (metal) partially contacts with a part of the wall of the container except for its bottom due to a defect in centering, for example, the discharge slightly concentrates on the contact portion, and consequently the film formation can be nonuniform. However, in the present invention, the dielectric member 50 is an insulator, and thus a uniform film can be formed also in such a situation.

In the present invention, a barrier film that prevents an odorous component such as an aroma from being adsorbed or absorbed in the container, as well as a barrier film that prevents transmission of gas, liquid, or molecules are also included.

A procedure of forming a film on the container inner face using the barrier-film forming apparatus having the dielectric member 50 will be explained in more detail with reference to FIGS. 7 to 12. The container 12 having an approximately tubular shape with its cross section being approximately square is used as an example.

Figure 7:
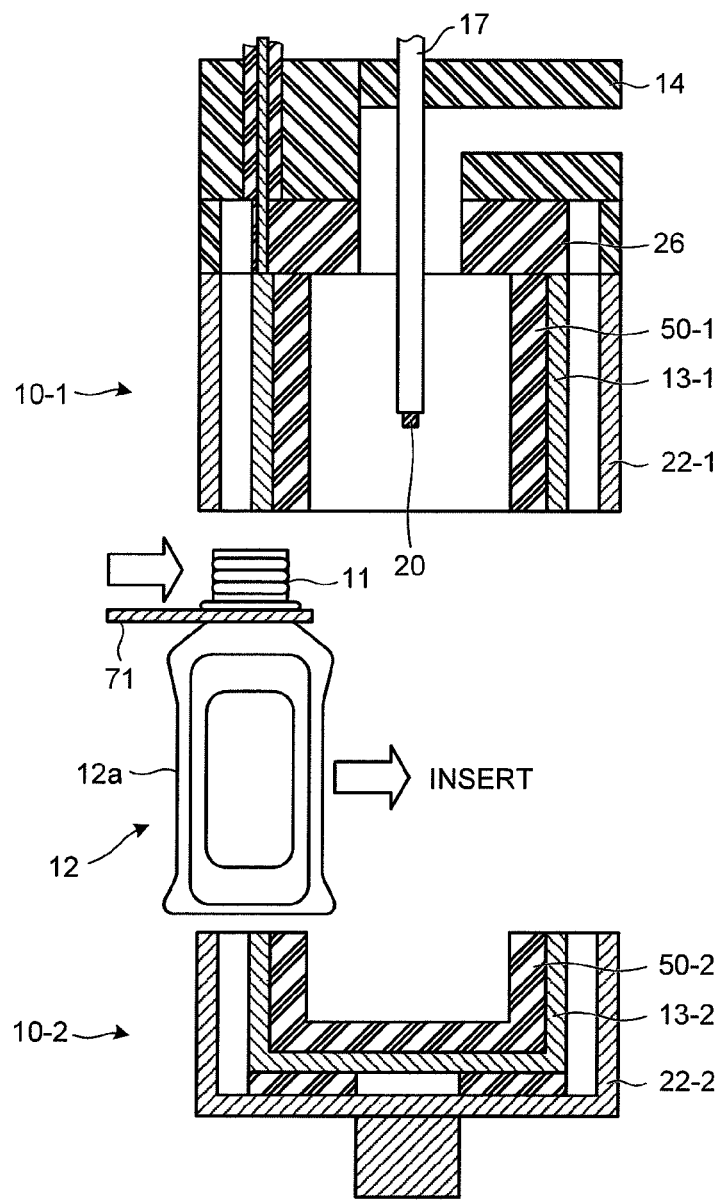
FIG. 7 is a process chart of forming a film on an inner face of a container using the barrier-film forming apparatus.

First, FIG. 7 depicts a state where insertion of the container is started. As shown in FIG. 7, the film forming apparatus is divided in a vertical axis direction thereof into two, i.e., an upper apparatus 10-1 and a lower apparatus 10-2. Insertion by an insertion jig 71 is started to position the container 12 above the lower apparatus 10-2.

Figure 8:
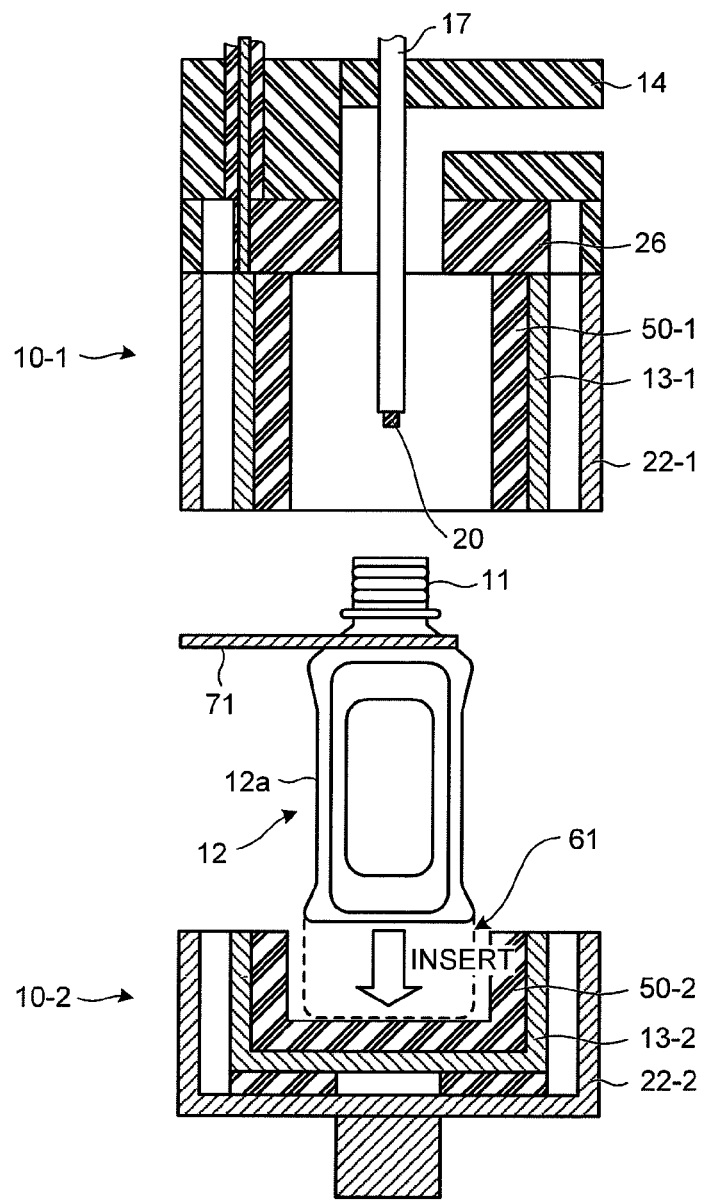
FIG. 8 is a process chart of forming a film on an inner face of a container using the barrier-film forming apparatus.

In FIG. 8, the container 12 is inserted into the lower dielectric member 50-2 in the vertical axis direction.

A maximum path on which the cross section of the container passes (indicated by a broken line) is referred to here as a container maximum path line 61. When the container is inserted, the body of the container is supported by a jig (not shown) to prevent a fall of the container and perform centering thereof.

FIG. 9 depicts a state where the insertion of the container into the lower dielectric member 50-2 is completed, and the bottom of the container 12 is placed within the lower dielectric member 50-2.

Figure 10:
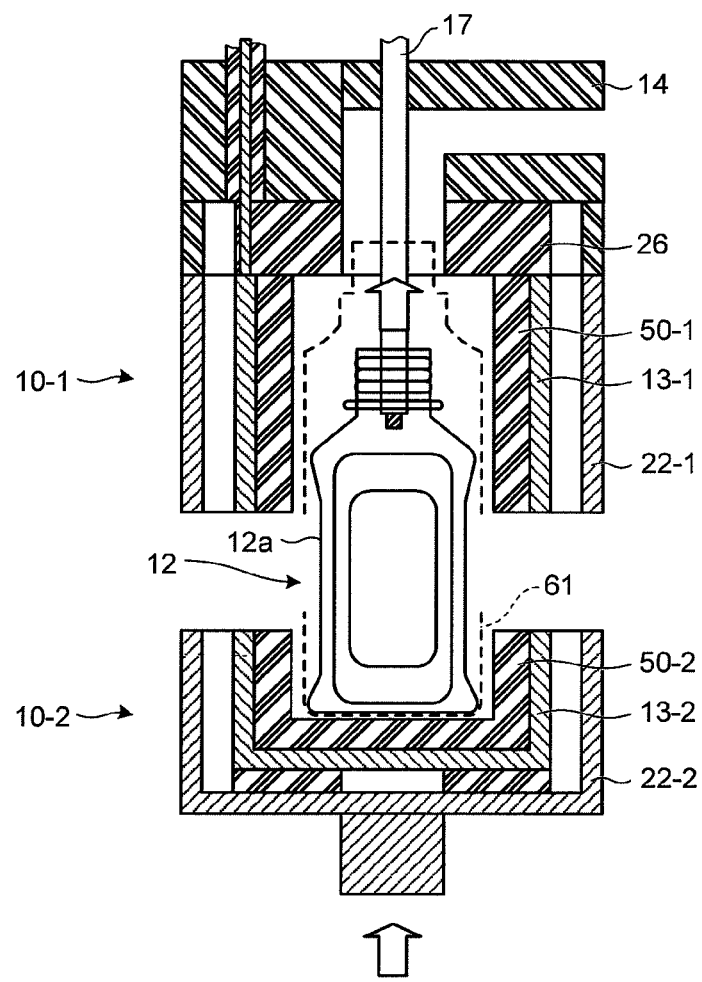
FIG. 10 is a process chart of forming a film on an inner face of a container using the barrier-film forming apparatus.

FIG. 10 depicts a state where the lower apparatus 10-2 is lifted by the pusher (not shown) to insert the mouth 11 of the container 12 into the upper apparatus 10-1.

Figure 11:
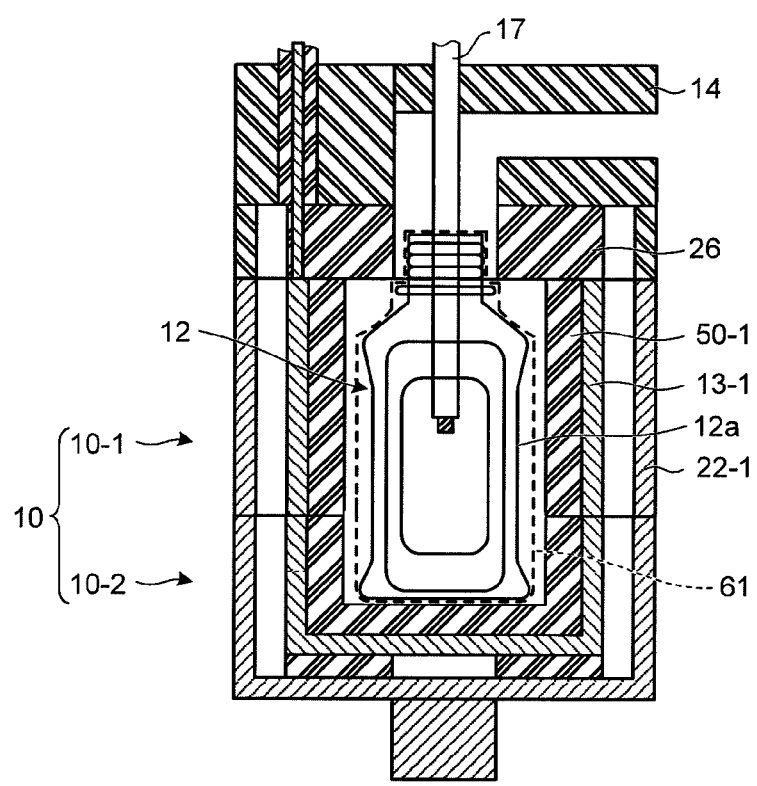
FIG. 11 is a process chart of forming a film on an inner face of a container using the barrier-film forming apparatus.

FIG. 11 depicts a state where the insertion of the container 12 into the barrier-film forming apparatus 10 is completed.

Figure 12:
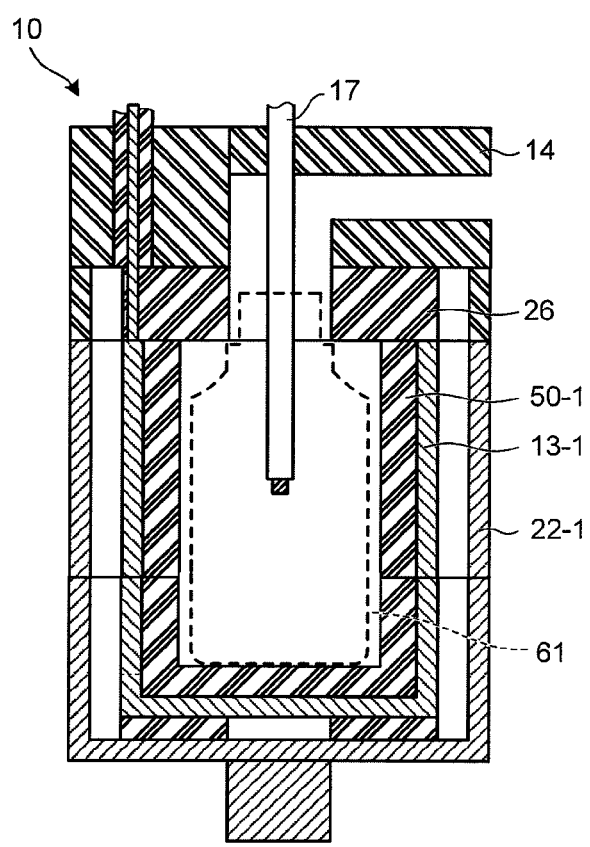
FIG. 12 is a process chart of forming a film on an inner face of a container using the barrier-film forming apparatus.

FIG. 12 depicts the completed insertion state shown in FIG. 11, in which the container 12 is not shown. The container maximum path line 61 finally becomes a container visible line excluding the concave portion (depressed portion) 12a.

In this way, when the dielectric member 50 is positioned outside of the container maximum path line 61 without contacting the container 12, with the inner face of the dielectric member 50 separated from the container 12 with a predetermined clearance 51, the film formed on the container inner face can be uniformized. In the present embodiment, the container inner volume is 500 milliliters and the clearance 51 is 1 millimeter.

The dielectric member 50 is installed so that the cavity sized to enclose the container 12 matches a space formed by the container maximum path line 61 on which the outer circumference of the container 12 passes, or has a clearance outside of the space. In this way, uniform film formation can be achieved.

It is also possible to prepare a plurality of the dielectric members 50 having various cavity shapes to select one of the dielectric members 50 to suit the shape of the container 12 as the processing target, and then form a barrier film on the container. In this way, it is possible to handle the shape and size of the container and perform uniform film formation.

A principle indicating that the installation of the dielectric member 50 achieves uniformity in film quality and film thickness on the entire container will be explained next with reference to FIGS. 2 to 4 and 35 to 37.

Figure 2:
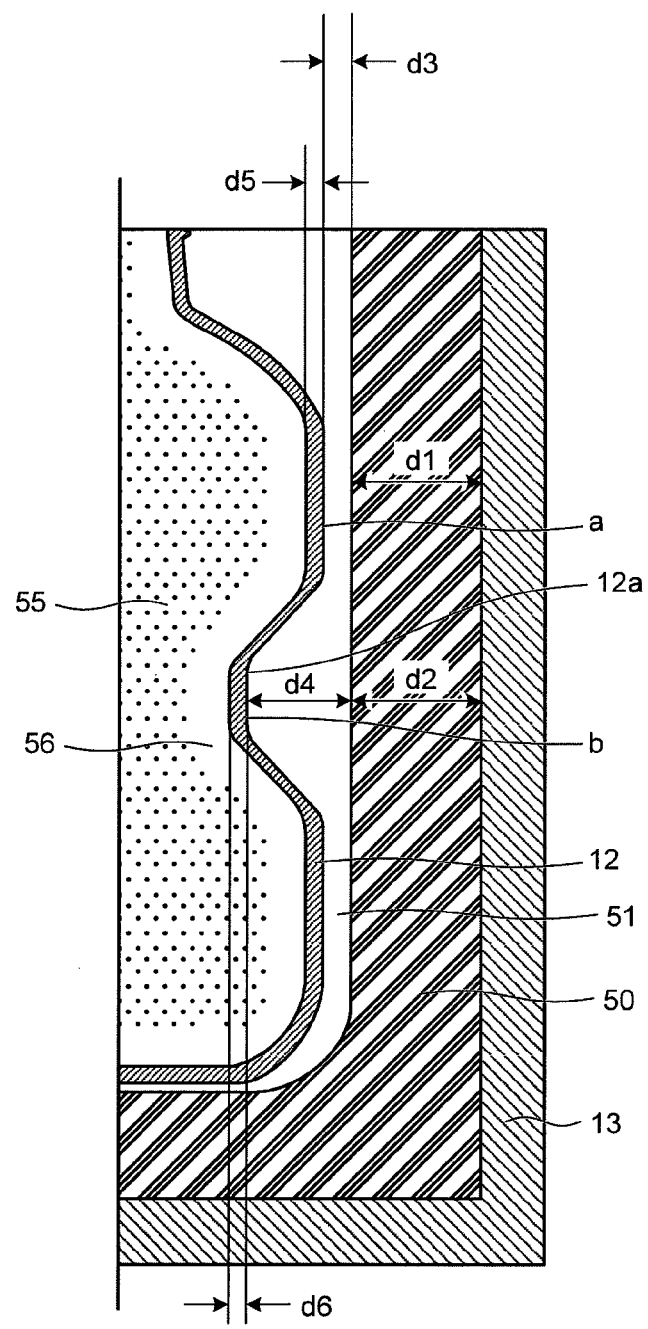
FIG. 2 is a principle diagram of film formation in which a dielectric member is installed.

In FIG. 2, reference numeral 12 denotes the plastic container, 12a denotes the concave portion (or the constricted portion), 13 denotes the external electrode, 50 denotes the dielectric member, 55 denotes a plasma bulk portion (it is considered that impedance of the bulk portion is low and potential in the bulk portion is almost constant), and 56 denotes a plasma sheath portion. Reference "a" denotes a portion (close portion) where the dielectric member 50 and the container 12 are close to each other, and b denotes a portion (distant portion) where the dielectric member 50 and the concave portion 12a of the container 12 are distant from each other. Reference $d_1$ denotes a thickness of the dielectric member 50 at the close portion "a", $d_2$ denotes a thickness of the dielectric member 50 at the distant portion b, $d_3$ denotes a distance between the dielectric member 50 and the container 12 at the close portion "a", $d_4$ denotes a distance between the dielectric member 50 and the container 12 at the distant portion b, $d_5$ denotes a thickness of the container 12 at the close portion "a", and $d_6$ denotes a thickness of the container 12 at the distant portion b. In this explanation, the container having an approximately tubular shape with a cross section thereof being substantially circular is used as an example.

According to the present invention, the following is assumed. Because the dielectric member 50 is installed between the external electrode 13 and the container 12, uniformity in distribution of impedance Z from the inner face of the external electrode 13 to the inner surface of the container 12 is improved, and thus uniformity in voltage drop at this portion is improved. Therefore, uniform voltage is applied to the inner surface of the container 12, thereby improving uniformity in the discharge in the container 12 and further improving uniformity in the barrier film formed on the container inner surface. Consequently, the barrier property of the entire container is enhanced.

The reason why the distribution of the impedance Z from the inner face of the external electrode to the container inner surface comes close to uniformity by installing the dielectric member 50 is considered as follows.

Figure 37:
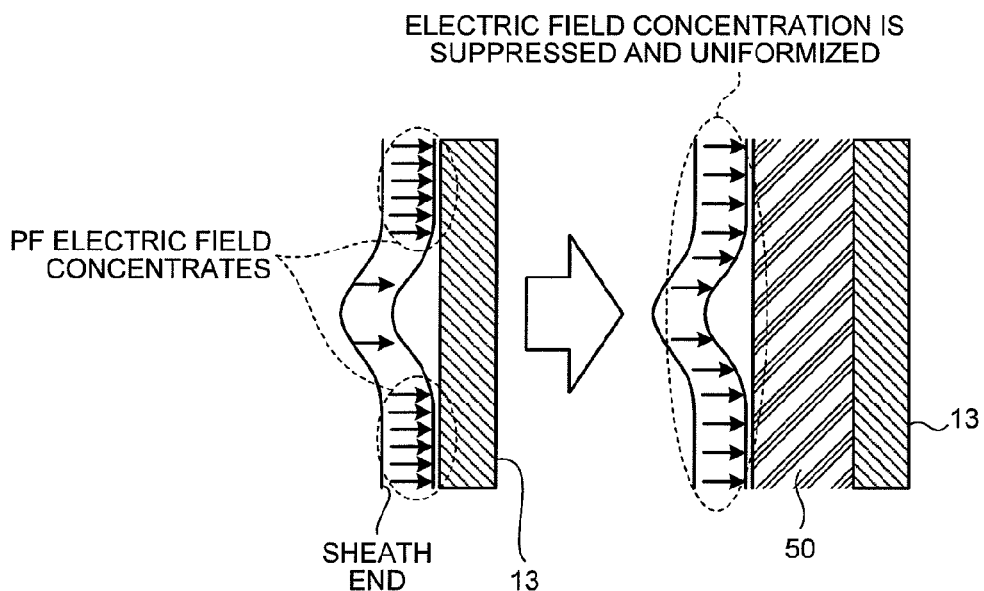
FIG. 37 is a conceptual diagram of improvement in a barrier property by using a dielectric member.

FIG. 37 is a conceptual diagram of barrier property improvement by the dielectric member as a mechanism. A left drawing in FIG. 37 depicts a conventional apparatus in which the dielectric member 50 is not installed, and a right drawing depicts the apparatus according to the present invention in which the dielectric member 50 is installed.

In the conventional technique as shown by the left drawing in FIG. 37, RF potential at the plasma sheath edge is assumed to be almost the same in the bottle. Therefore, in the case of the external electrode 13 as a similar metal electrode, an RF electric field at a portion where the bottle closely contacts the electrode becomes intense and an RF electric field at a portion where the bottle is separated from the electrode becomes weak. Consequently, a difference is generated between the portion where the RF electric field is concentrated and the portion where the RF electric field is not concentrated.

On the other hand, in the present invention as shown by the right drawing in FIG. 37, when the dielectric member 50 of resin or the like is used, a distance between the external electrode 13 and the sheath edge becomes larger, and thus the concentration of the RF electric field is suppressed.

In this case, the resin produces little RF (high-frequency) loss in the dielectric, and thus the RF power supplied to the external electrode 13 produces the RF electric field at the sheath portion without loss. Because there is no loss, the RF electric field has the same magnitude as an average of those in the case where the similar metal electrode is used. This RF electric field generates more uniform plasma.

As a result, the RF electric field becomes uniform and uniform plasma is generated, so that a direct-current (DC) bias occurring at the sheath becomes uniform. Consequently, icon energy becomes uniform and the film thickness becomes uniform. Because the plasma is uniform, the film forming seeds are generated uniformly, so that the film thickness becomes uniform.

Further, approximately, following arithmetics provide effective guidelines.

The electric field that generates discharge in the present invention is an alternating electric field, and can be an electric field having a power supply frequency f of AC, LF, RF, VHF, a microwave, or the like, or including a pulse. In this case, a displacement current can flow through the dielectric member installed between the external electrode and the container inner surface, and the space.

The impedance Z of the dielectric member or the space can be obtained by an expression (1) indicated by a following "Expression 1".

[Expression 1]

$$Z = \frac{1}{j\omega C} \quad (1)$$

where: $\omega$ denotes an angular frequency (or power supply frequency), and $C$ denotes a capacitance of the dielectric member between the external electrode and the container, or the space (per unit area).

Because $\omega$ is constant in this case, the impedance Z is determined by the capacitance C.

For example, the capacitance C in a case where the dielectric member and the space are arranged in series as shown in FIG. 2 can be obtained by an expression (2) indicated by a following "Expression 2".

[Expression 2]

$$C = \frac{1}{\sum_i \varepsilon_i \cdot \varepsilon_0 \frac{1}{d_i}} \quad (2)$$

where $i$ denotes the dielectric member or the space,
$d$ denotes a range (thickness) of each portion,
$\varepsilon_1$ denotes a relative permittivity, and
$\varepsilon_0$ denotes a permittivity in vaccum (in air).

A converted distance G can be obtained using the expressions (1) and (2) by an expression (3) indicated by a following "Expression 3".

[Expression 3]

$$Z \propto G = \sum_i \frac{d_i}{\varepsilon_i} \quad (3)$$

where $G$ denotes an converted distance.

That is, the converted distance G is the sum of the ranges (thicknesses) $d_1$ of respective portions divided by the relative permittivity $\in_1$. The relative permittivity $\in$ of the space is 1.

The converted distance G corresponds to a range (thickness) of an electrical space when a dielectric is entirely replaced by a space. According to this definition, uniformity of the impedance Z from the inner face of the external electrode to the inner surface of the container is represented by uniformity of the converted distance G, that is, a ratio of the converted distances G at respective positions of the container.

Therefore, when the ratio of the converted distances G is smaller, the impedance Z from the inner face of the external electrode to the inner surface of the container becomes more uniform, and thus the barrier film formed on the inner surface of the container becomes approximately uniform. Accordingly, the barrier property is improved.

The ratio of the converted distances G in the conventional technique (in the case where no dielectric is provided) is explained first as a comparative example.

To simplify the explanation, only two points, which are both ends of the spectrum (the close portion "a" and the distant portion b) as shown in FIG. 2 are considered, and the wall (thickness) of the container 12 is ignored because it is sufficiently thin ($d_5=d_6=0$).

In FIG. 2, when the dielectric member 50 is replaced by metal, for example, the metal constitutes a part of the external electrode, which becomes a stimulant of the conventional technique. That is, the conventional external electrode having a cavity along the container maximum path line is obtained.

In this case, $d_1=d_2=0$ and the relative permittivity $\in$ of the space is 1. Therefore, the converted distance Gmin at the close portion "a" is $d_3$, and the converted distance Gmax at the distant portion b is $d_4$.

Accordingly, the ratio Gmax/Gmin of the converted distances is $d_4/d_3$.

A ratio of the converted distances G in the present invention (in the case where the dielectric member is provided) will be explained.

In FIG. 2, the dielectric member 50 is made of resin ("Teflon®"), for example.

In this case, the converted distance Gmin at the close portion "a" is $d_3+d_1/\in_D$, and the converted distance Gmax at the distant portion b is $d_4+d_2/\in_D$.

Here, $\in_D$ denotes a relative permittivity of the dielectric.

Because $d_1=d_2$ in the example shown in FIG. 2, the ratio Gmax/Gmin between the converted distances G is $(d_4+d_1/\in_D)/(d_3+d_1/\in_D)$.

Because $d_4>d_3$ and $d_1/\in_D<0$, the ratio Gmax/Gmin between the converted distances G in the present invention is smaller than that of the comparative example (conventional technique) described above, which indicates that the uniformity is improved (uniformity is obtained).

Figure 3:
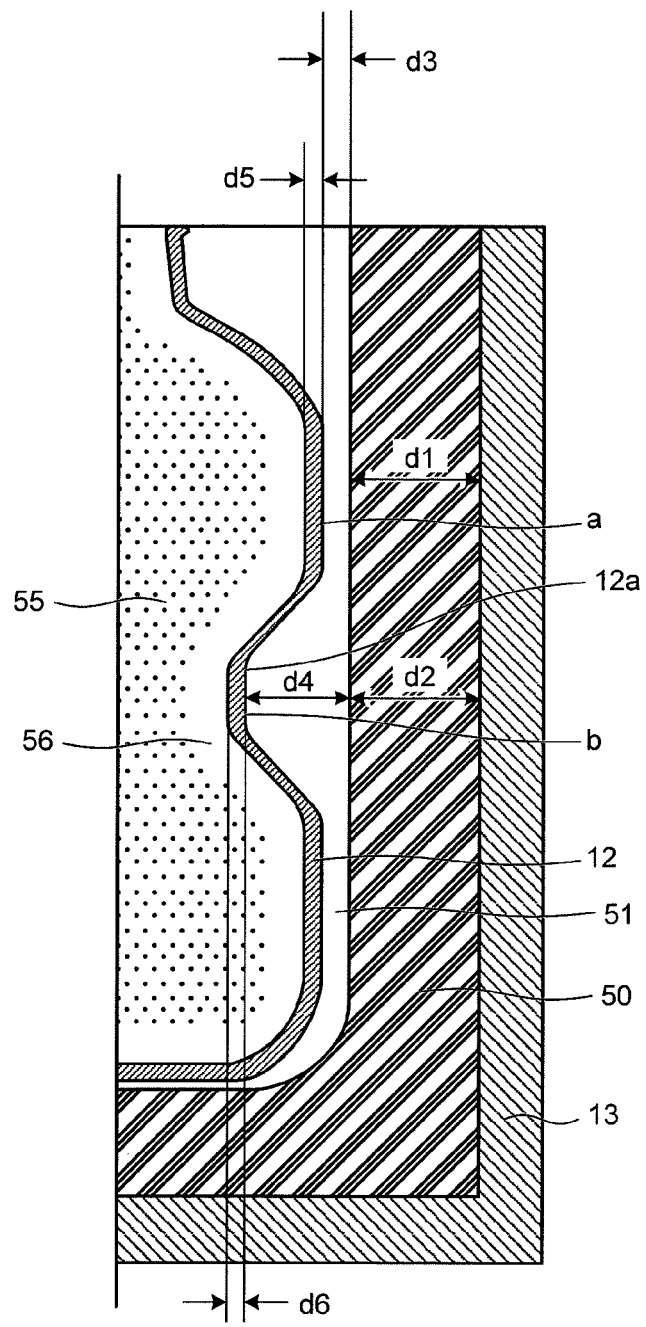
FIG. 3 is a principle diagram of film formation in which a dielectric member is installed.

In the configuration as shown in FIG. 2, the dielectric member and the external electrode are installed to enclose the entire container. However, a relative permittivity ($\in_i$) of a dielectric member 50B of a portion facing the portion b at which the clearance between the container 12 and the dielectric member is large can be made different from a relative permittivity ($\in_i$) of a remaining dielectric member 50A, thereby changing the converted distances, as shown in FIG. 3. This further contributes to the uniformity of the voltage applied to the inner face of the container.

Figure 4:
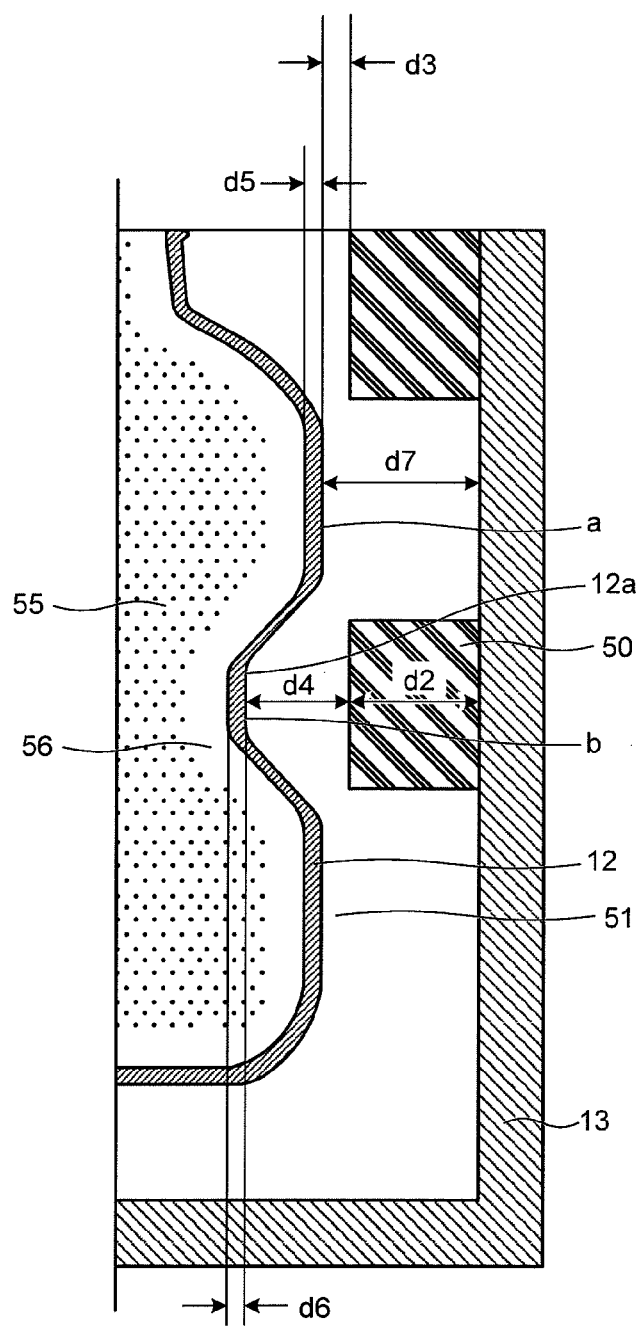
FIG. 4 is a principle diagram of film formation in which a dielectric member is installed.

It is also possible that the dielectric member 50 is installed to cover a position of the electrode facing the portion b at which the space between the container 12 and the electrode is large and a space is formed at the remaining portion, thereby changing the converted distances, as shown in FIG. 4. This contributes to substantial uniformity of the voltage applied to the inner face of the container. Although not shown, a thin dielectric member can be attached to a metal surface of the external electrode not to expose the metal surface in the space.

Specific explanations will be given below with reference to actual comparison and experiment results shown in "Table 1" and "Table 2".

Also in the following discussion, the thicknesses $d_5$ and $d_6$ of the container are ignored ($d_5=d_6=0$) because the wall of the container is sufficiently thin.

In comparative examples 1 to 4 shown in Table 1, the depth of the concave portion (constrained portion) 12a of the container was varied in the conventional technique (replacing the dielectric member with metal) to check the ratio Gmax/Gmin of the converted distances G at the close portion "a" and the distant portion b, and a barrier improvement factor (BIF).

The barrier improvement factor was measured by using a common MOCON method.

TABLE 1

|  |  | Comparative example | | | |
|---|---|---|---|---|---|
| Experiment number | Symbol | 1 | 2 | 3 | 4 |
| Outer chamber configuration | | Metal nesting | | | |
| Outer chamber shape | | Shape along container maximum path line | | | |
| Bottle constriction depth | | 0 mm | 5 mm | 10 mm | 15 mm |
| Close portion | | | | | |
| Design clearance (mm) | $d_3$ | 0.75 | 0.75 | 0.75 | 0.75 |
| Dielectric thickness (mm) | $d_1$ | 0 | 0 | 0 | 0 |
| Dielectric relative permittivity | $\epsilon_1$ | 1 | 1 | 1 | 1 |
| Converted distance G | Gmin | 0.75 | 0.75 | 0.75 | 0.75 |
| Distant portion | | | | | |
| Design clearance (mm) | $d_4$ | 0.75 | 0.75 | 0.75 | 0.75 |
| Constriction range (mm) | | 0 | 5 | 10 | 15 |
| Dielectric thickness (mm) | $d_2$ | 0 | 0 | 0 | 0 |
| Dielectric relative permittivity | $\epsilon_2$ | 1 | 1 | 1 | 1 |
| Effective distance G | Gmax | 0.75 | 5.75 | 10.75 | 15.75 |
| Ratio Gmax/Gmin of effective distances G | | 1 | 8 | 14 | 21 |
| Barrier improvement factor BIF (times) | | 26.3 | 10.2 | 7.0 | 6.5 |
| $O_2$ passage amount (cc/pkg/day) | | 12.4 | 32.0 | 46.0 | 51.0 |

TABLE 2

| Experiment number | Symbol | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Outer chamber configuration | | Teflon thickness 2 mm | | | Teflon thickness 4 mm | | | Teflon thickness 4 mm | Teflon thickness 8 mm | Teflon thickness 2 mm | Teflon thickness 4 mm | Vinyl chloride thickness 4 mm |
| Outer chamber shape | | Shape along container maximum path line | | | | | | Cylindrical shape with bottom | | | | |
| Bottle constriction depth | | 0 mm | 5 mm | 10 mm | 0 mm | 5 mm | 10 mm | | | 10 mm | | |
| Close portion | | | | | | | | | | | | |
| Design clearance (mm) | $d_3$ | 1 | 1 | 1 | 1 | 1 | 1 | 1 | 1 | 3 | 3 | 3 |
| Dielectric thickness (mm) | $d_1$ | 2 | 2 | 2 | 4 | 4 | 4 | 4 | 8 | 2 | 4 | 4 |
| Dielectric relative permittivity | $\epsilon_1$ | 2.1 | 2.1 | 2.1 | 2.1 | 2.1 | 2.1 | 2.1 | 2.1 | 2.1 | 2.1 | 3.1 |
| Converted distance G Distant portion | Gmin | 1.95 | 1.95 | 1.95 | 2.90 | 2.90 | 2.90 | 2.90 | 4.81 | 3.95 | 4.90 | 4.29 |
| Design clearance (mm) | $d_4$ | 1 | 1 | 1 | 1 | 1 | 1 | 1 | 1 | 3 | 3 | 3 |
| Constriction range (mm) | | 0 | 5 | 10 | 0 | 5 | 10 | 20 | 20 | 20 | 20 | 20 |
| Dielectric thickness (mm) | $d_2$ | 2 | 2 | 2 | 4 | 4 | 4 | 4 | 8 | 2 | 4 | 6 |
| Dielectric relative permittivity | $\epsilon_2$ | 2.1 | 2.1 | 2.1 | 2.1 | 2.1 | 2.1 | 2.1 | 2.1 | 2.1 | 2.1 | 3.1 |
| Effective distance G | Gmax | 1.95 | 6.95 | 11.95 | 2.95 | 7.90 | 12.90 | 22.90 | 24.81 | 2.95 | 24.90 | 24.29 |
| Ratio Gmax/Gmin of effective distances G | | 1 | 4 | 6 | 1 | 3 | 4 | 8 | 5 | 6 | 5 | 6 |
| Barrier improvement factor BIF (times) | | 33.0 | 19.5 | 22.4 | 35.0 | 29.9 | 25.4 | 9.3 | 12.7 | 11.2 | 12.7 | 18.0 |
| $O_2$ passage amount (cc/pkg/day) | | 12.0 | 20.0 | 17.0 | 11.3 | 13.0 | 15.0 | 41.0 | 30.0 | 34.0 | 30.0 | 22.0 |

Results of the experiments show that when the concave portion (constricted portion) 12*a* has a larger depth, the ratio Gmax/Gmin of the converted distances G becomes larger, and the barrier improvement factor is greatly reduced.

Next, in examples 1 to 3, the dielectric member ("Teflon®") 50 has an inner cavity with a shape along the container maximum path line, and has a thickness of 2 millimeters. With respect to the same depth of the concave portion (constricted portion) 12*a*, the ratios Gmax/Gmin of the converted distances G in these examples become smaller than those in the comparative examples. Consequently, the barrier improvement factors are greatly enhanced.

In examples 4 to 6, the thickness of the dielectric member ("Teflon®") 50 is increased and set at 4 millimeters. Accordingly, the ratios Gmax/Gmin of the converted distances G are further reduced, and the barrier improvement factors are further enhanced.

In examples 7 to 11, the dielectric member has a tubular shape having a bottom with the cavity in the dielectric member being cylindrical, and an projection at the container shoulder as shown in FIG. 2 is not provided. Accordingly, unlike the examples 1 to 6, the shoulder is separated from the electrode farther than at the container constricted portion. That is, the distant portion b is situated at the shoulder, and there is a large space at the shoulder. Accordingly, while the barrier properties are relatively lower than those in the examples 1 to 6, the barrier properties are improved so much as compared to the conventional case in which no dielectric member is provided.

In the examples 7 and 8, the dielectric members ("Teflon®") 50 have different thicknesses (4 millimeters and 8 millimeters). In the examples 9 and 10, the thickness of the dielectric member is 4 millimeters, and the clearance d3 is changed. In the example 11, the material of the dielectric member is changed to a hard vinyl chloride.

Also in these examples, there was a tendency that the barrier improvement factor is further enhanced when the ratio Gmax/Gmin of the converted distances G is smaller.

Therefore, it was found that the average thickness/the permittivity of the dielectric member had preferably a range of 2 mm/2.1 to 8 mm/2.1=0.95 to 3.8.

Figure 35:
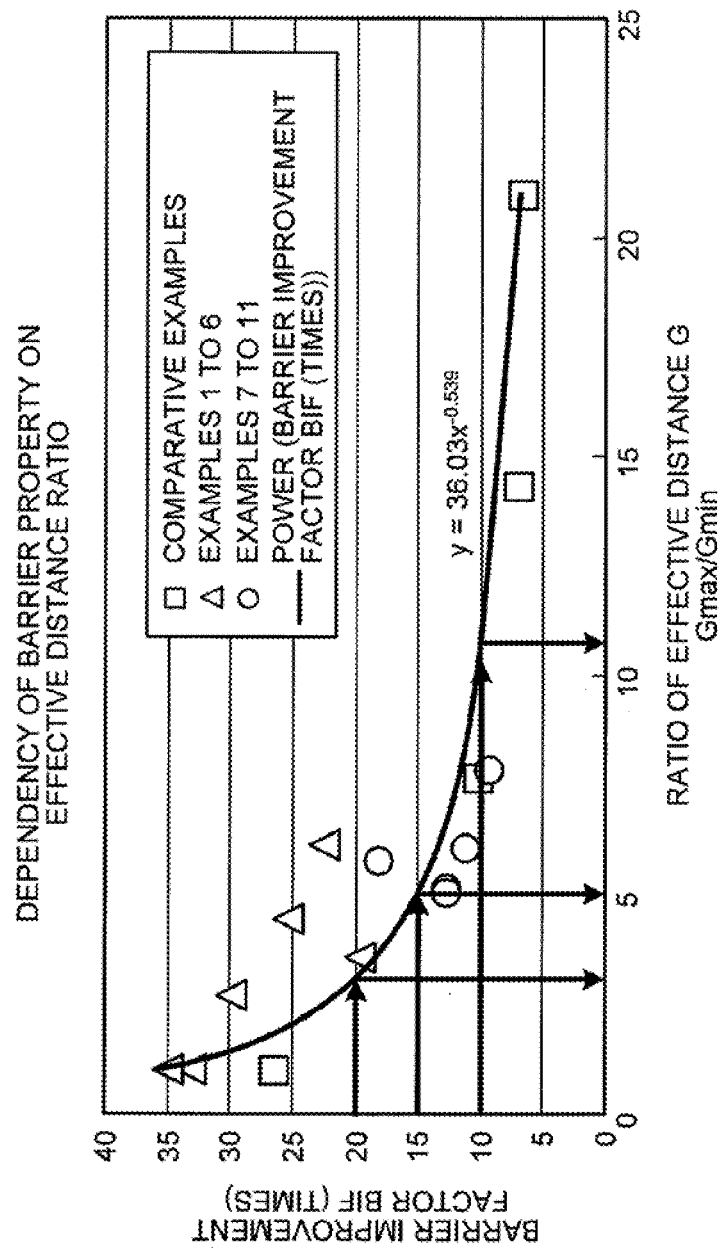
FIG. 35 is a relationship diagram between a barrier improvement factor and a converted distance ratio.

FIG. 35 collectively depicts these data in terms of the ratio Gmax/Gmin of the converted distances G and the barrier improvement factor.

An approximate expression of all the data is obtained from FIG. 35 as the following expression (4).

$$y=36.03x^{-0.539} \quad (4)$$

Generally, a coated barrier container is required to have a barrier property ten or more times, or preferably fifteen or more times higher than that of the original container. By using the approximate expression (4), it was found that the ratio Gmax/Gmin between the maximum converted distance and the minimum converted distance should be equal to or larger than 1 and equal to or smaller than 11 to have the barrier property ten or more times higher, and be equal to or large than 1 and equal to or smaller than 5 to have the barrier property fifteen or more times higher. The ratio of the converted distances is a nondimensional number (value with no unit) because it is obtained by dividing a distance by a distance.

These data come true in the case of a typical vertically-long container having a circular cross section (such as a PET bottle). When the container has a special shape, a similar tendency is indicated while the absolute value can be slightly different.

As described above, the improvement in the barrier property due to the installation of the dielectric member 50 is effective also when the barrier-film forming apparatus including the external electrode and the dielectric member having the same shape is used for containers of different shapes.

That is, even when the clearance between the container and the cavity of the dielectric member is increased because of the different container shapes, influence on the ratio Gmax/Gmin of the converted distances can be reduced. The tubular shapes with bottoms in the examples 7 to 11 are suitable for such an application because they can be used regardless of the container shapes when the diameter and the length are acceptable.

This eliminates the need to prepare the external electrodes or the dielectric members of all shapes similar to various types of containers. Therefore, a great advantage is achieved because type change is not required or it is only necessary to select one of dielectric members of several shapes, which is most suited to each bottle, and use the selected one for manufacturing.

In this application, the clearance can be greatly increased.

In the present invention, the metallic surface of the external electrode does not directly face a large space between the container and the external electrode because of the installation of the dielectric member. Therefore, it is possible to prevent generation of unwanted discharge in the space.

The following was also found from FIG. 35. It is desirable that, as a method for applying uniform voltage to the inner face of the container and obtaining a high barrier property, the sum of d/∈ with respect to the minimum distance from the inner surface of the container to the dielectric member 50 or the external electrode 13 is obtained, and the ratio Gmax/Gmin of the converted distances is set to be equal to or smaller than 11 (corresponding to the barrier property ten times higher), preferably equal to or smaller than 5 (corresponding to the barrier property fifteen times higher), and more preferably equal to or smaller than 3.2 (corresponding to the barrier property twenty times higher).

Ideally, it is desirable that the sum is obtained by integration at each point of the container. As an alternative method, it is possible to set points at intervals of 0.5 centimeter, for example, from the mouth tip of the container to the bottom of the container, and obtain the sum at each point. At this time, it is possible to set container surface points on the cross section of the container passing through the center of the container, for example.

As another method, it is possible to obtain a standard deviation/an average of the sum of d/∈ at the respective container surface positions by using the examples 1 to 11 and the comparative examples 1 to 3. At this time, these container surface positions can be set on the cross section surface of the container. In this case, it is possible that the standard deviation/the average of the sum of d/∈ at the respective container surface positions is equal to or lower than 0.75 (corresponding to the barrier property ten times higher), preferably equal to or lower than 0.66 (corresponding to the barrier property fifteen times higher), and more preferably equal to or lower than 0.57 (corresponding to the barrier property twenty times higher). The comparative example 4 is eliminated because the constriction depth is 15 millimeters.

Figure 36:
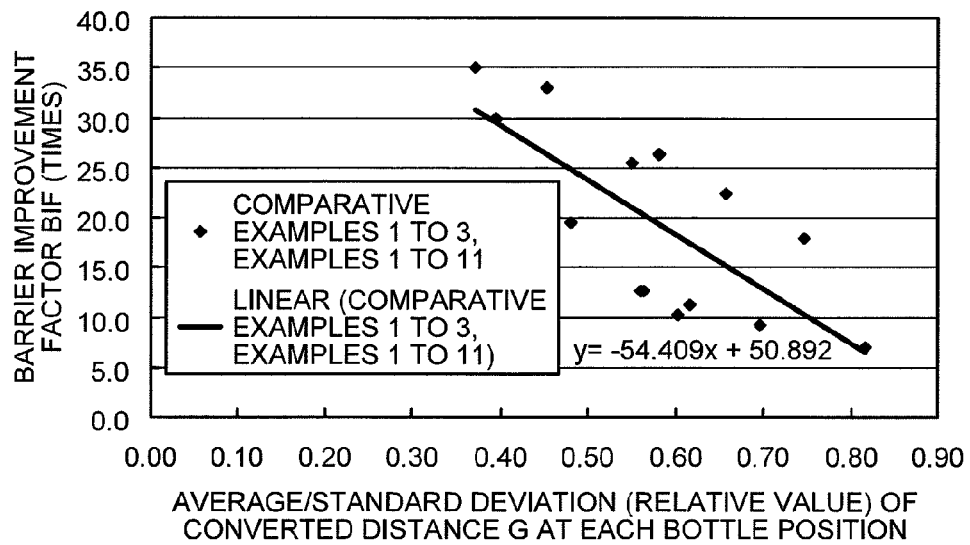
FIG. 36 is a relationship diagram between an average/a standard deviation of the converted distances G at each position in the container and the barrier improvement factor BIF.

These results are shown in Table 3 and FIG. 36.

TABLE 3

| | Example | | | | | | | | | | | Comparative example | | |
|---|---|---|---|---|---|---|---|---|---|---|---|---|---|---|
| | 1 | 2 | 3 | 4 | 5 | 6 | 7 | 8 | 9 | 10 | 11 | 1 | 2 | 3 |
| STD/AVE | 0.45 | 0.48 | 0.66 | 0.37 | 0.39 | 0.55 | 0.7 | 0.56 | 0.62 | 0.56 | 0.75 | 0.58 | 0.6 | 0.82 |
| BIF | 33 | 19.5 | 22.4 | 35 | 29.9 | 25.4 | 9.3 | 12.7 | 11.2 | 12.7 | 18 | 26.3 | 10.2 | 7 |
| OTR | 12 | 20 | 17 | 11.3 | 13 | 15 | 41 | 30 | 34 | 30 | 22 | 12.4 | 32 | 46 |

The present invention can provide uniform film formation over the entire container because the voltage applied to the container inner face is made approximately uniform by using the dielectric member located between the external electrode and the container, and the clearance between the external electrode and the container or the clearance between the dielectric member and the container inner face.

On the other hand, when a similar electrode is used like in the conventional technique (Patent Document 1 or 2), it is practically difficult to obtain a completely similar shape due to the accuracy in molding of the container, the accuracy in production of the external electrode 13 or the spacer 25, or the accuracy in installation of the container. Therefore, a higher barrier property cannot be obtained. The external electrode and the internal electrode are quite close to each other at a portion having a quite small diameter from the mouth to the shoulder of the container. Accordingly, the approximate theory as described above cannot be applied, and the electric field on the inner surface of the container becomes quite large even when the voltage applied to the container inner surface at that portion is the same as that at the remaining portion. Therefore, the discharge becomes high, the film forming rate is increased, and thus a uniform thin film cannot be formed.

It is estimated that the approximate theory holds true at portions in which the diameter of the container is not significantly small and the plasma potential can be assumed to be almost the same, and does not hold true at portions having small diameters such as the mouth and the shoulder.

There is another proposition (Patent Document 3) of providing a clearance between the external electrode and the container mainly for the purpose of reducing a large electric field from the mouth to the shoulder of the container. When a container having concaves and convexes is a target, the shape of the clearance needs to be adjusted from an approximate similar shape to be suited to the concave and convex portions, thereby obtaining a shape that enables the container to be inserted into the clearance and have a high barrier property. Therefore, the external electrodes need to be produced almost entirely to order to be suited to diversified container shapes, which increases cost and labor. Further, because the clearance is increased, the plasma is easily generated in the clearance. Accordingly, the clearance width has a limitation, the effect of applying uniform voltage is restrictive, and thus it is difficult to obtain a uniform thin film on the entire container. In addition, the problem of the voltage distribution due to the accuracy in molding of the container, the accuracy in production of the external electrode 13 or the spacer 25, or the accuracy in installation of the container cannot be resolved, and thus a high barrier property cannot be obtained. Variations in the improvement of the barrier property are likely to increase.

Further, there are the proposition (Patent Document 4) of providing a dielectric spacer mainly at positions corresponding to the mouth and the shoulder of the container, and the proposition (Patent Document 5) of extending the dielectric spacer to the lower portion of the container. These propositions also have a primary object to reduce a large electric field from the mouth to the shoulder of the container. Therefore, while these propositions can adjust the film attachment to a small-diameter portion of the shoulder of a container that has no concave and convex at the body and to which an electrode or a spacer having a similar shape can be applied, these propositions cannot achieve entire uniformity including the film attachment to the body of the container having concaves and convexes at the body. These propositions cannot resolve the problem resulting from the accuracy in molding of the container, the accuracy in production of the external electrode 13 or the spacer 25, or the accuracy in installation of the container, either. Accordingly, a high barrier property cannot be obtained.

In the conventional techniques, there is the proposition (Patent Document 6) of the film forming apparatus in which the plastic external cylinder that electrically contacts the electrode and is a certain distance separated from the film formation target is provided between the electrode and the film formation target. However, this apparatus forms a film on both of inner and outer faces of the container and has a primary object to prevent heat application to the container. Accordingly, this proposition is completely different from the present invention aimed at forming a film only on an inner face of the container and having an object to improve film distribution by uniformizing the voltage distribution. Therefore, this proposition provides no guideline for improving the reduced barrier property resulting from the uniformity in the film distribution or the various accuracies, which becomes an issue in forming a film on the container having concaves and convexes at the body or the like.

The foregoing is the study with respect to the cross section in a direction horizontal to the direction of the insertion of the container into the external electrode. A cross sectional direction perpendicular to the insertion axis of the container will be studied below.

Figure 13:
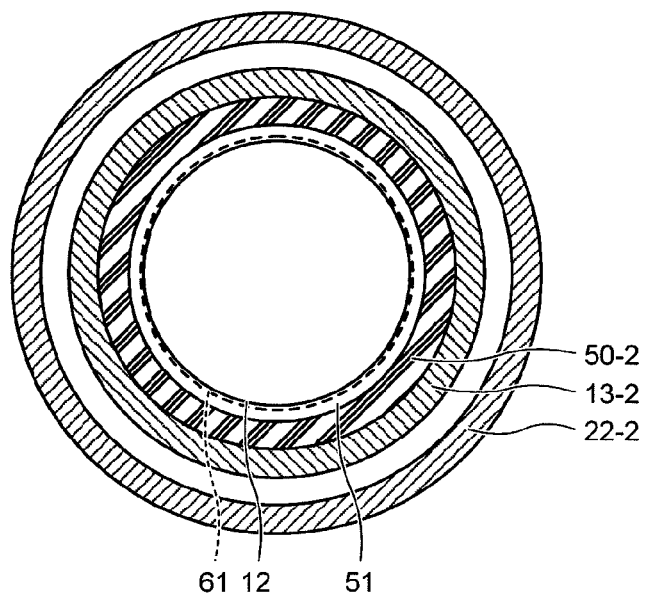
FIG. 13 depicts a relation between a dielectric member and a maximum path line of a container.
Figure 14:
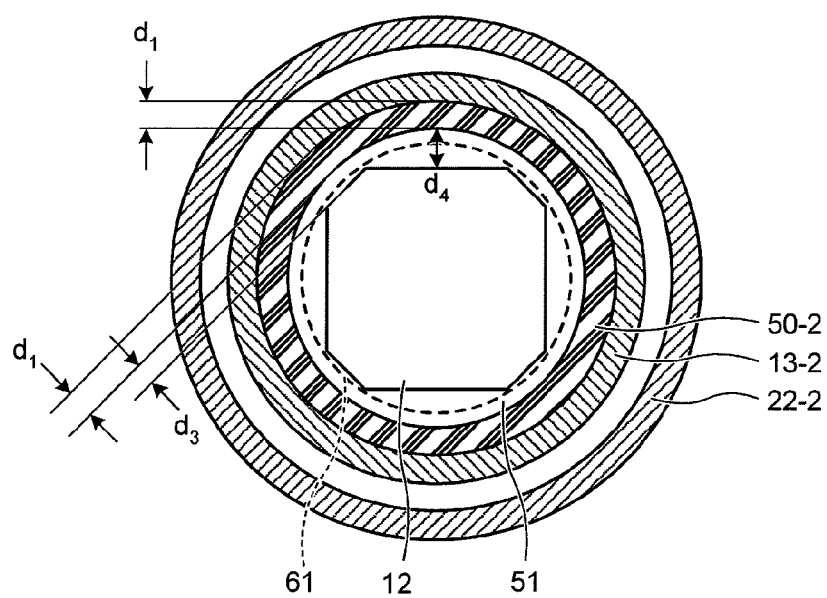
FIG. 14 depicts another relation between a dielectric member and a maximum path line of a container.
Figure 15:
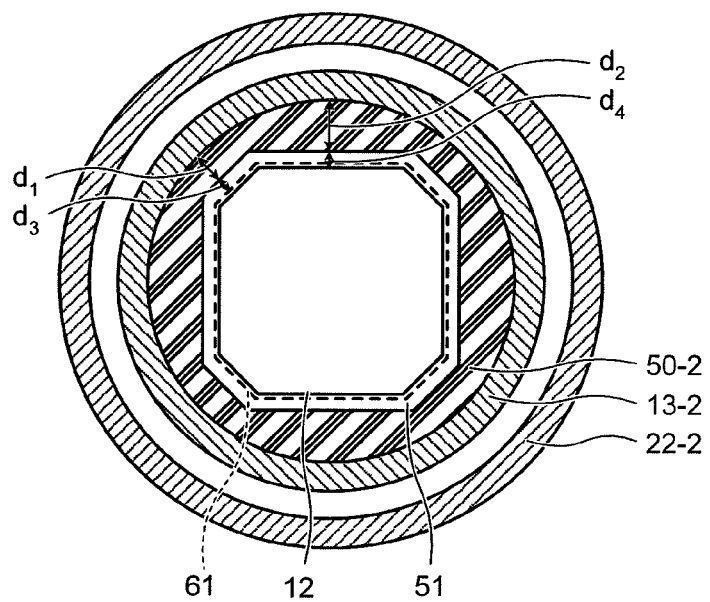
FIG. 15 depicts still another relation between a dielectric member and a maximum path line of a container.

FIGS. 13 to 15 depict the containers 12 having circular and square cross sections, and the like.

As shown in FIG. 13, when the container 12 has a substantially circular cross section, the converted distances G are substantially uniform at any point, and thus there is no influence on the barrier property.

FIG. 14 depicts a case where a container (square) having an unfixed radius such as a polygon is inserted to be coated.

Also in this case, like in the case of the horizontal cross section, the ratio Gmax/Gmin of the converted distances G is $(d_4+d_1/\in_D)/(d_3+d_1/\in_D)$ and is smaller than that in the case where no dielectric member is provided, and therefore an enhanced barrier property is obtained.

Only by providing one dielectric member having such a shape, the present invention can handle containers from a circular container to various types of square containers.

Unlike a dielectric member having a square cavity as shown in FIG. 15, the container can be inserted into the apparatus at a free angle without the need of adjusting the angle in the axial direction of the container. Therefore, an inserting device can be simplified.

Finally, FIG. 15 depicts a case of a dielectric member having a square cavity similar to the outer shape of the container. In this case, because a part of $d_4$ is replaced by $d_2$ of the relative permittivity $\in_D$, the ratio Gmax/Gmin $(=(d_4+d_2/\in_D)/(d_3+d_i/\in_D))$ of the converted distances G becomes smaller than (b), and thus the barrier property is enhanced. In this case, a dielectric having a larger $\in_D$, for example alumina, is more preferably used as the dielectric member because the converted distances G become smaller.

Although not shown, the external electrode can have a prism tubular shape.

A polygonal dielectric member can be used for a polygonal container based on the same concept as for the square shape.

The dielectric member 50 preferably encloses at least the body of the container 12.

The dielectric member 50 can be of a tubular shape with a bottom or approximately a tubular shape with a bottom. Alternatively, the dielectric member 50 can be of a tubular shape without bottom or a tubular shape partially having a bottom.

A part of the external electrode 13 facing the space of the concave portion 12a of the container 12 can be covered by the dielectric member 50.

A part of the cavity of the dielectric member 50 or approximately the entire cavity can be in approximate contact with the container.

A part of the dielectric member facing the concave portion 12a of the container 12 can have a different relative permittivity $\in$.

The dielectric member can have a convex shape to be suited to the shape of the concave portion.

Dielectric members having different relative permittivities $\in_i$ can be laminated.

In this way, the sum of the converted distances $d_i/\in_i$ from the inner surface of the external electrode to the inner surface of the container is made approximately uniform over the approximately entire container by variously setting the material of the dielectric member and the thickness of the space, thereby achieving uniformity in the formed film.

The conventional techniques have the problem in that even for the container 12 having no concave portion 12a, it is practically difficult to form the external electrode and the like in a shape completely similar to the container due to the accuracy in molding of the container, the accuracy in production of the external electrode 13 or the space 25, or the accuracy in installation of the container, and therefore a high barrier property cannot be obtained. However, in the present invention, the uniformity in the voltage applied to the inner face of the container can be obtained by the dielectric member, and thus the uniform film can be formed on the inner face of the container, which enhances the barrier property.

Preferably, the container has an approximately tubular shape. The container of a tubular shape indicates a container having a small mouth and a large body and being vertically long, and its side has a cylindrical shape or a prism tubular shape with panels. Containers with and without concave and convex portions are included.

Figure 5:
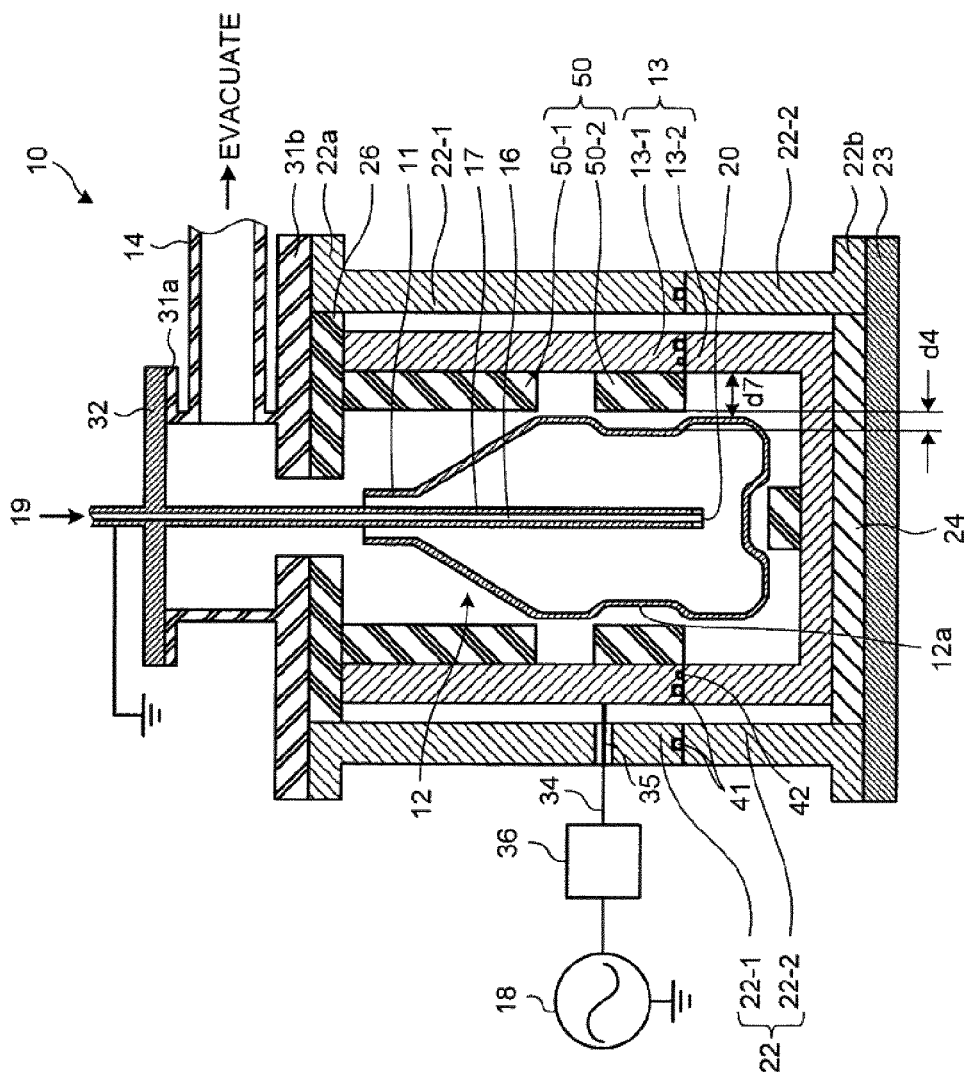
FIG. 5 is a schematic diagram of another barrier-film forming apparatus according to the first embodiment.

FIG. 5 depicts a barrier-film forming apparatus including the dielectric members at positions facing the concave portions of the container, as another example of the present embodiment. Also with this apparatus, the voltage can be made approximately uniform by using the dielectric member 50 installed between the external electrode and the container, and a clearance $d_7$ between the external electrode 13 and the container 12 or the clearance $d_4$ between the dielectric member 50 and the container 12, which enables to form a uniform film over the entire container, as explained with reference to FIG. 4. When the metallic electrode is exposed to the relatively large clearance as in this example, abnormal discharge may be generated. Accordingly, at least a thin dielectric can be provided on the surface of the external electrode to suppress the abnormal discharge.

Figure 6:
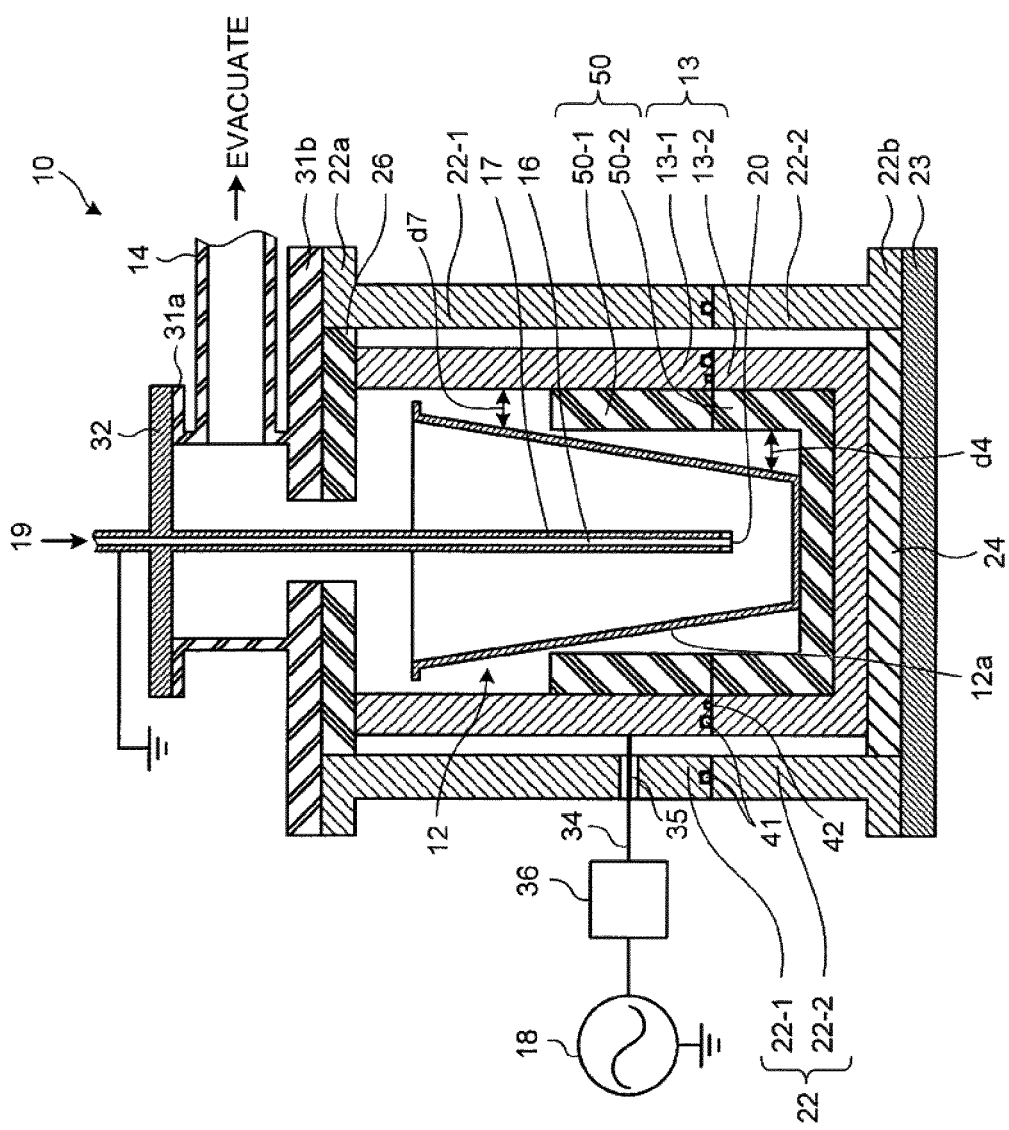
FIG. 6 is a schematic diagram of still another barrier-film forming apparatus according to the first embodiment.

FIG. 6 depicts the container 12 having an upper end largely opening like a cup. When a barrier film is to be formed in the container like a cup, the voltage can be made approximately uniform by using the dielectric member 50 installed between the external electrode and the container, and the clearance $d_7$ between the external electrode 13 and the container 12 or the clearance $d_4$ between the dielectric member 50 and the container 12, thereby enabling to form a uniform film over the entire container.

[Second Embodiment]

Figure 16:
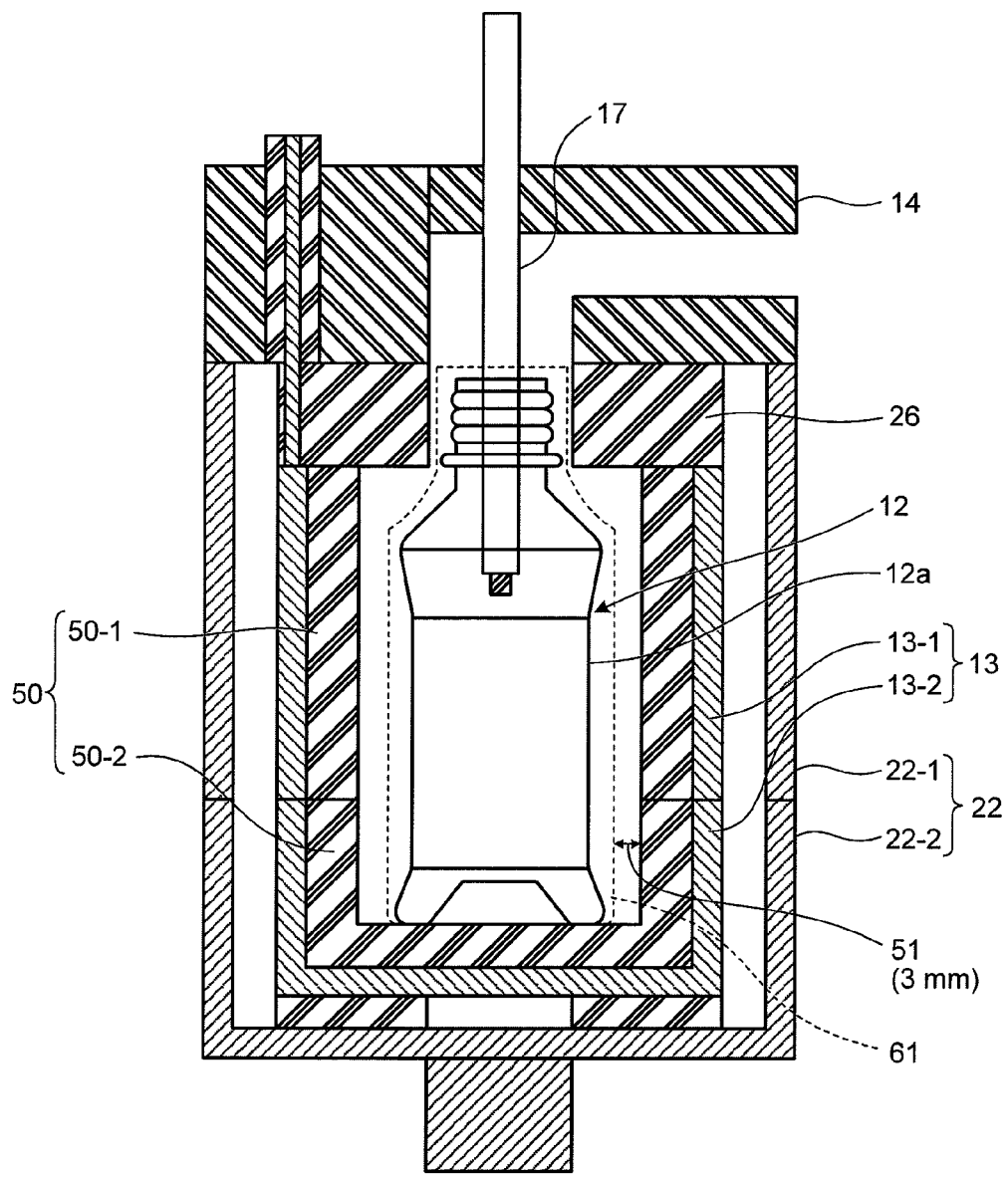
FIG. 16 is a schematic diagram of a barrier-film forming apparatus according to a second embodiment of the present invention.

FIG. 16 is a schematic diagram of a barrier-film forming apparatus according to another embodiment of the present invention.

As shown in FIG. 16, the shape of the container 12 is changed to have a circular cross section, and the clearance 51 is at least 3 millimeters.

According to the present embodiment, even when the clearance 51 between the dielectric member 50 and the container 12 is increased, a uniform and satisfactory film (having the BIF fifteen times higher or a higher BIF) can be formed on the inner face of the container.

[Third Embodiment]

Figure 17:
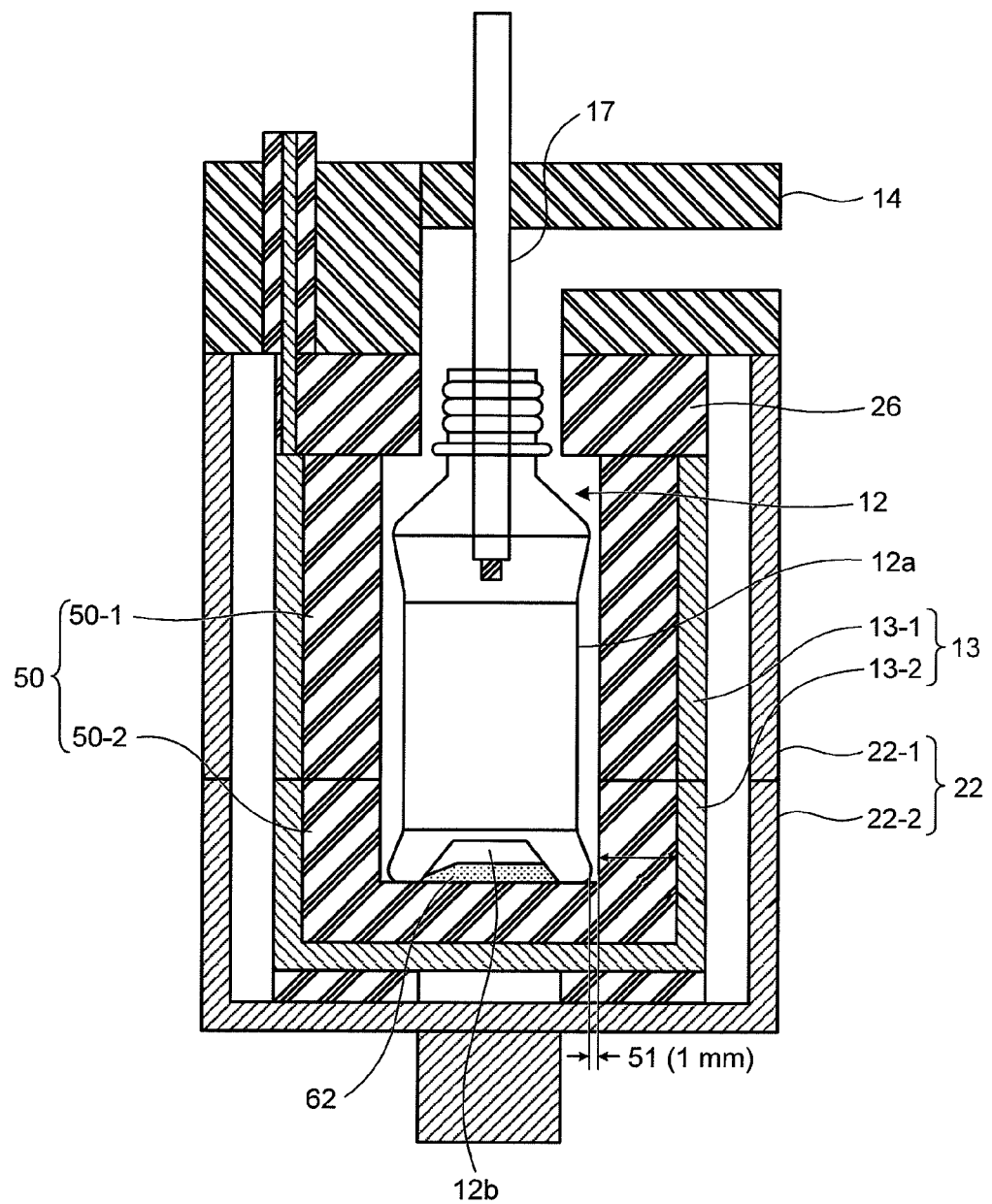
FIG. 17 is a schematic diagram of a barrier-film forming apparatus according to a third embodiment of the present invention.

FIG. 17 is a schematic diagram of a barrier-film forming apparatus according to still another embodiment of the present invention.

As shown in FIG. 17, the shape of the container 12 is changed to have a circular cross section, and the clearance 51 is at least 1 millimeter.

A dielectric member 62 of a convex shape corresponding to a concave portion 12b at the bottom of the container is further provided.

According to the present embodiment, uniform film formation can be achieved also at the concave portion 12b at the bottom of the container, as well as the concave portion 12a at the body of the container.

[Fourth Embodiment]

Figure 18:
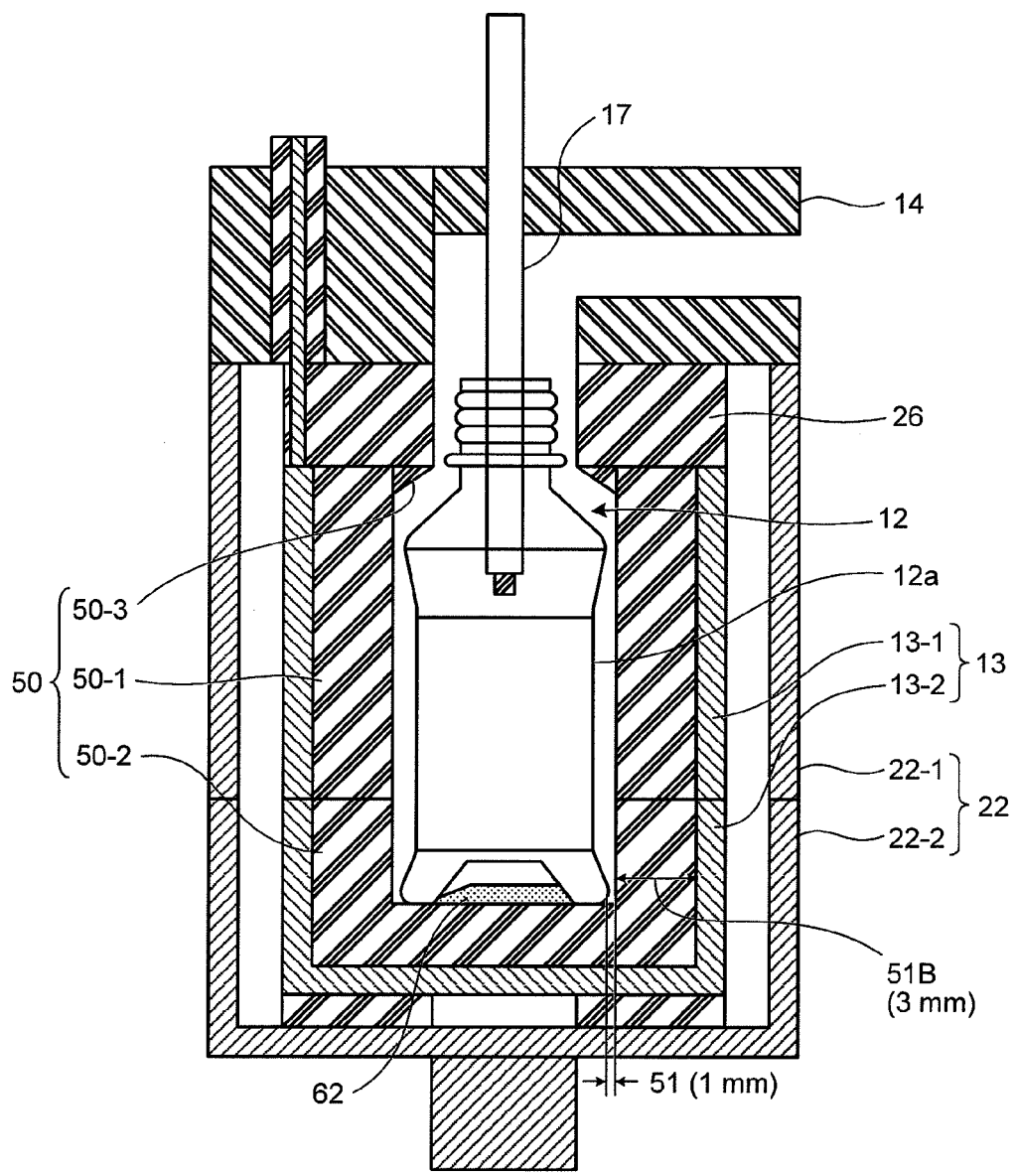
FIG. 18 is a schematic diagram of a barrier-film forming apparatus according to a fourth embodiment of the present invention.

FIG. 18 is a schematic diagram of a barrier-film forming apparatus according to still another embodiment of the present invention.

As shown in FIG. 18, in the present embodiment, an upper projection 50-3 of the dielectric member is provided to the apparatus shown in FIG. 17 to enhance the electric field at the shoulder of the container 12. The shape of the projection does not need to completely fit the container shape to achieve the effect of the present invention, and the projection can have a shape with a margin that enables to accept various shoulder shapes of the container. The upper projection 50-3 also performs a centering function with respect to the central axis of the container mouth 11. It is assumed in the present invention that the approximately tubular shape of the dielectric member also includes shapes that include a portion not completely fitting the container but can accept various shapes of the containers.

According to the present embodiment, a uniform film can be formed also at the container shoulder, as well as at the container body.

[Fifth Embodiment]

Figure 19:
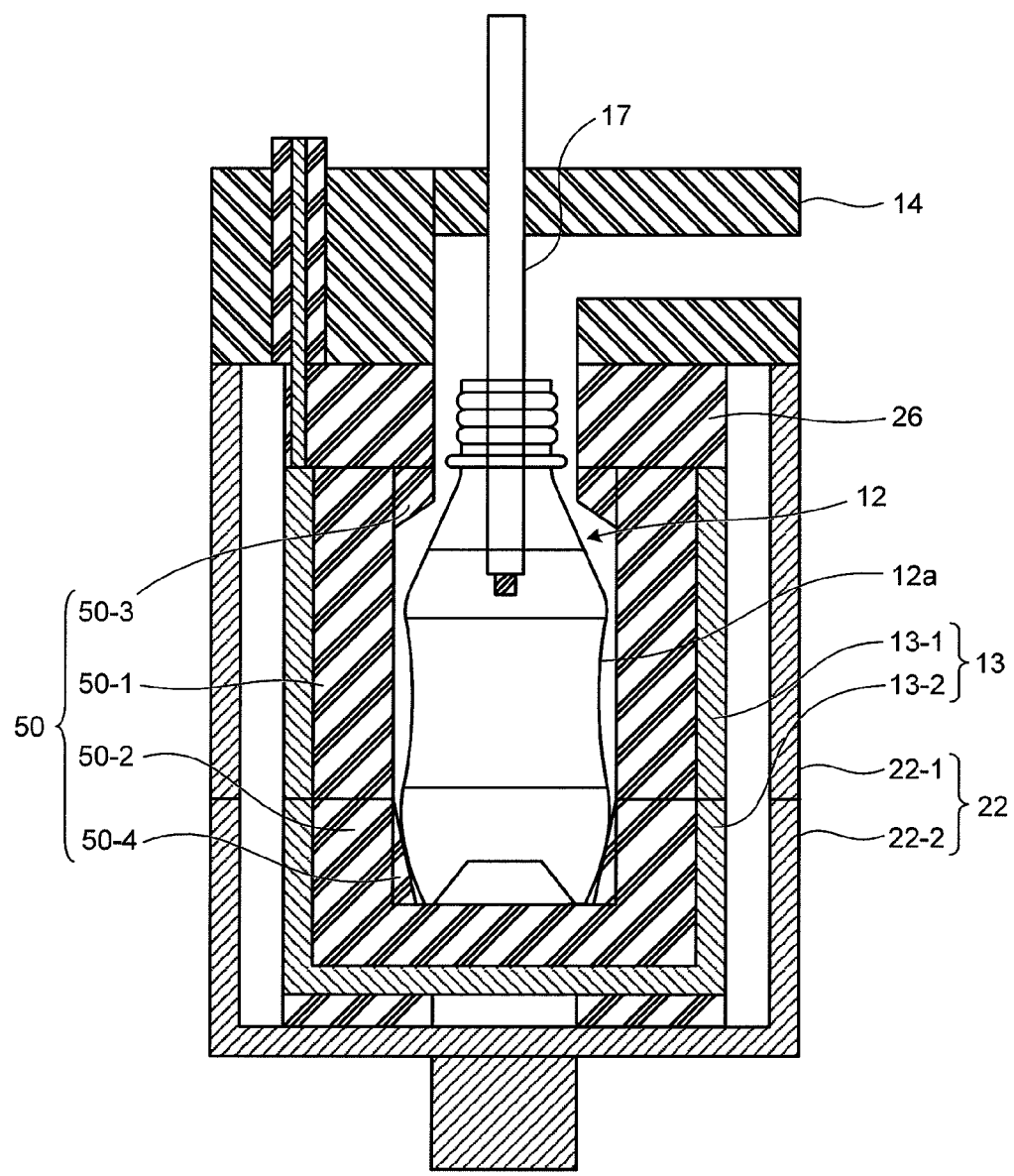
FIG. 19 is a schematic diagram of a barrier-film forming apparatus according to a fifth embodiment of the present invention.

FIG. 19 is a schematic diagram of a barrier-film forming apparatus according to still another embodiment of the present invention.

As shown in FIG. 19, a lower projection 50-4 of the dielectric member is provided to the apparatus as shown in FIG. 18 to further enhance the electric field on the lateral face at the bottom of the container 12. The lower projection 50-4 also performs a centering function with respect to the central axis of the container mouth 11.

The lower projection does not need to have a shape completely fit the container shape, and can have a shape with a margin that enables to accept various shapes of the bottom of the container. It is also possible to bring the lower projection into contact with the lateral face at the bottom of the container, thereby preventing fall of the container 12.

[Sixth Embodiment]

Figure 20:
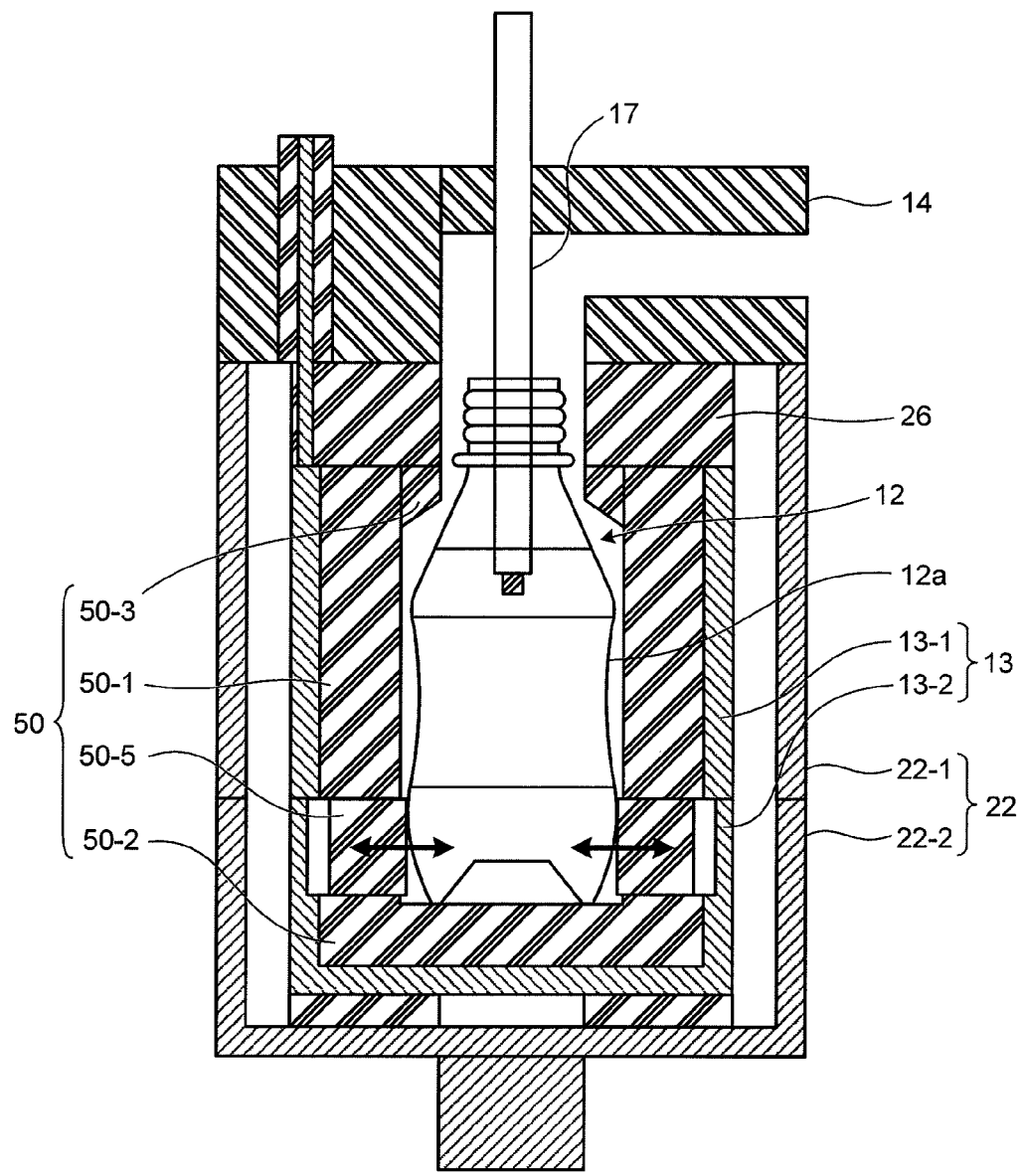
FIG. 20 is a schematic diagram of a barrier-film forming apparatus according to a sixth embodiment of the present invention.
Figure 21:
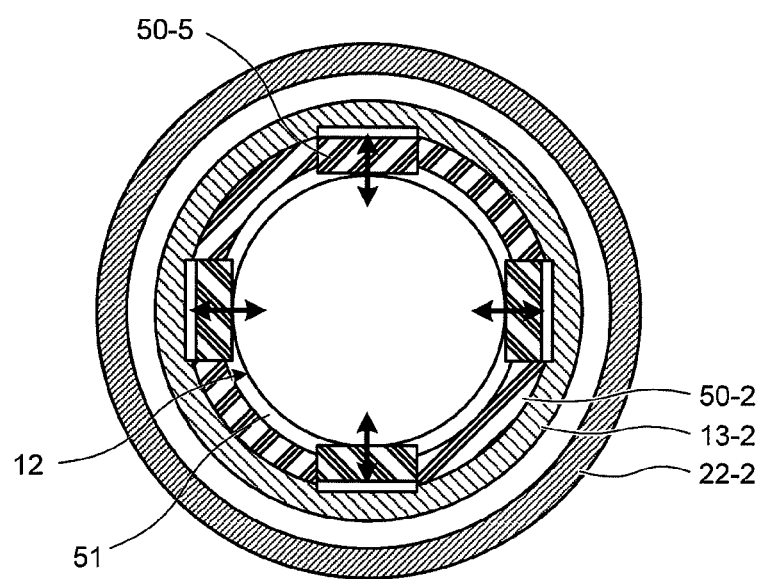
FIG. 21 is a cross-sectional view of relevant parts in FIG. 20.

FIGS. 20 and 21 are schematic diagrams of a barrier-film forming apparatus according to still another embodiment of the present invention.

As shown in FIGS. 20 and 21, a movable projection 50-5 of the dielectric member, which can freely move toward the central axis, is further provided to the apparatus as shown in FIG. 18 at the bottom of the container 12. The movable projection 50-5 can be a unit that is easily taken out, such as a spring mechanism and other similar configurations. The movable projection 50-5 centers the container 12 and prevents the container 12 from falling, when the container 12 is inserted. The movable projection 50-5 also has an effect of enhancing the electric field of the lateral surface of the container 12.

[Seventh Embodiment]

Figure 22:
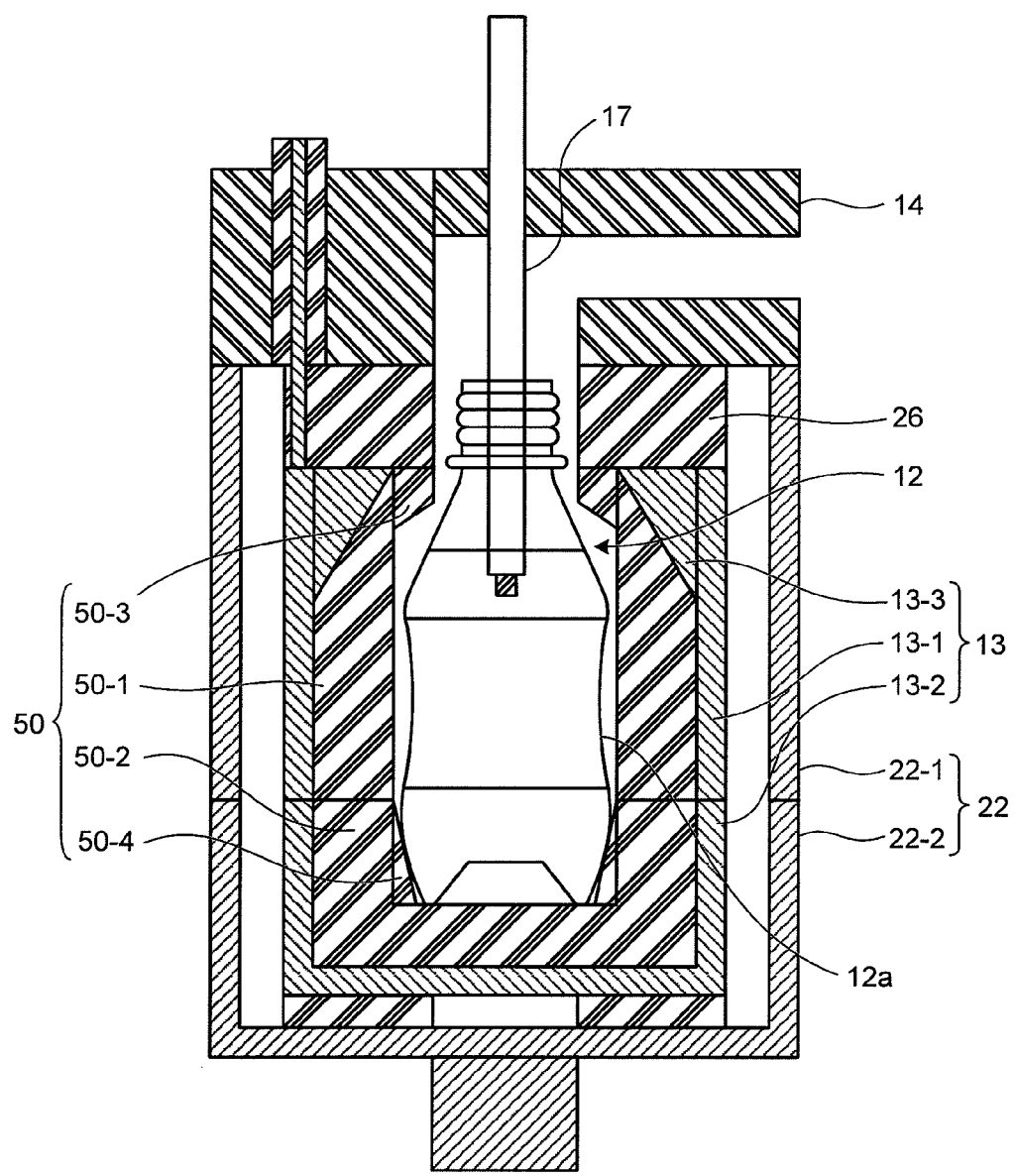
FIG. 22 is a schematic diagram of a barrier-film forming apparatus according to a seventh embodiment of the present invention.

FIG. 22 is a schematic diagram of a barrier-film forming apparatus according to still another embodiment of the present invention.

As shown in FIG. 22, a conical external electrode 13-3 is provided inside the upper external electrode 13-1 to assume various shoulder shapes of the container 12. To obtain a higher barrier property, the conical external electrode 13-3 can be further adapted to have a similar shape to a specific container, or have an approximately similar shape to some containers.

According to the present embodiment, by installing the conical external electrode 13-3, the thickness of the dielectric member at the shoulder of the container 12 becomes relatively approximately uniform, and the upper electric field of the container 12 becomes more uniform. Consequently, a more uniform film can be formed.

[Eighth Embodiment]

Figure 23:
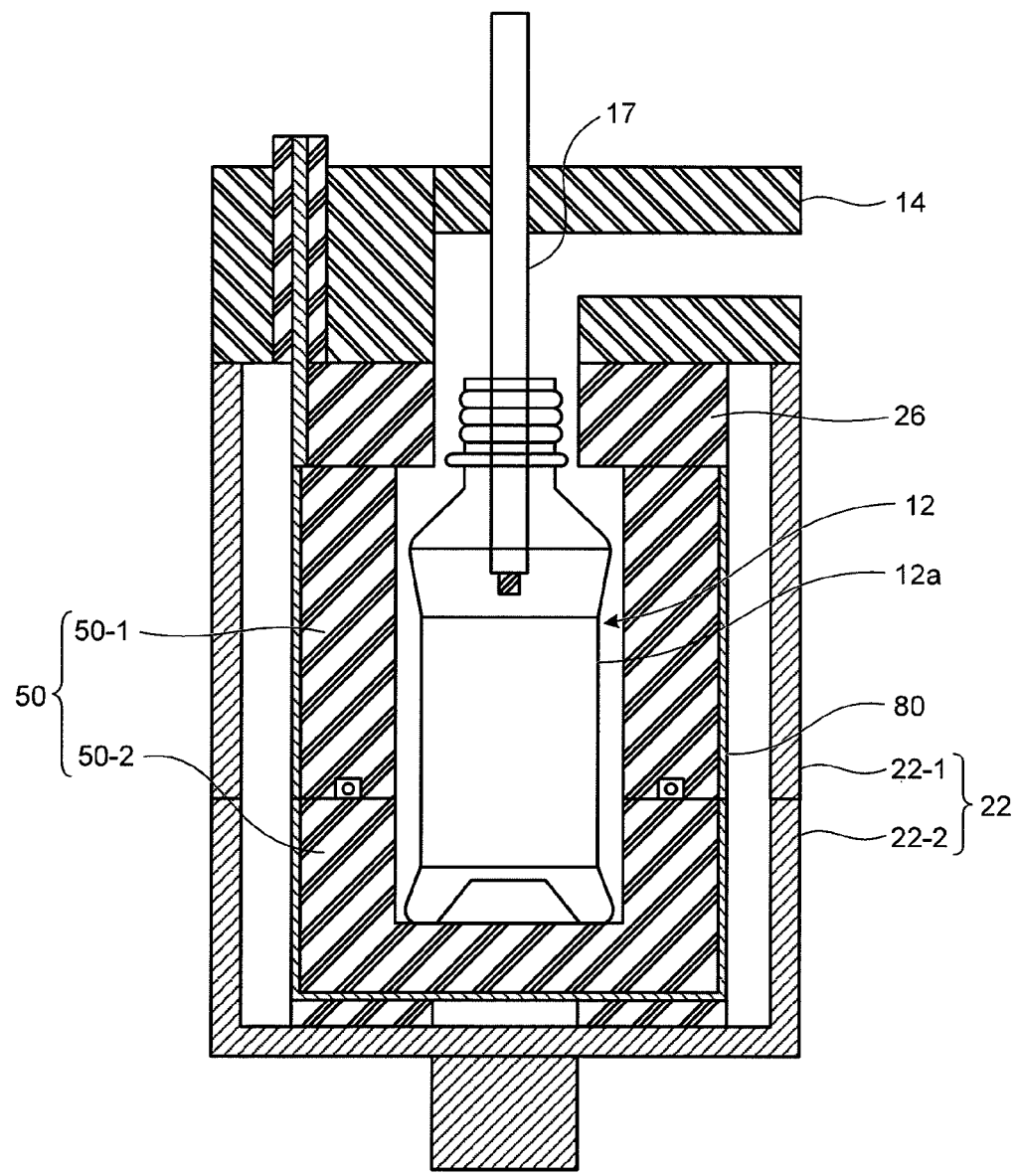
FIG. 23 is a schematic diagram of a barrier-film forming apparatus according to an eighth embodiment of the present invention.

FIG. 23 is a schematic diagram of a barrier-film forming apparatus according to still another embodiment of the present invention.

As shown in FIG. 23, in the present embodiment, the dielectric member forms a vacuum chamber, and a sheet-like metallic sheet 80 is attached around the dielectric member as the external electrode.

Preferably, the metallic sheet 80 is aluminum or stainless steel, for example, and its thickness is equal to or larger than about 50 micrometers, corresponding to a high-frequency skin effect. The thickness has no upper limit and can be about 5 millimeters, for example.

The sheet according to the present invention is not limited to a common metallic sheet, and can be a plate material like a can, a see-through metal such as a punched board and a net, or a thin film such as plating.

Further, contacts are preferably provided around the metallic sheet 80 to ensure electrical contact between upper and lower portions thereof.

In the present embodiment, in addition to the effects of the present invention described above, effects such as reduction in weight of the electrode configuration, improvement of flexibility in the design shape, reduction in production costs due to facilitation of mechanical processing, internal visualization by using a see-through metal and a transparent resin member (for example, transparent hard vinyl chloride), and facilitation in adjustment of the plasma distribution due to the internal visualization can be obtained. The earth shield is also a see-through metal.

[Ninth Embodiment]

Figure 24:
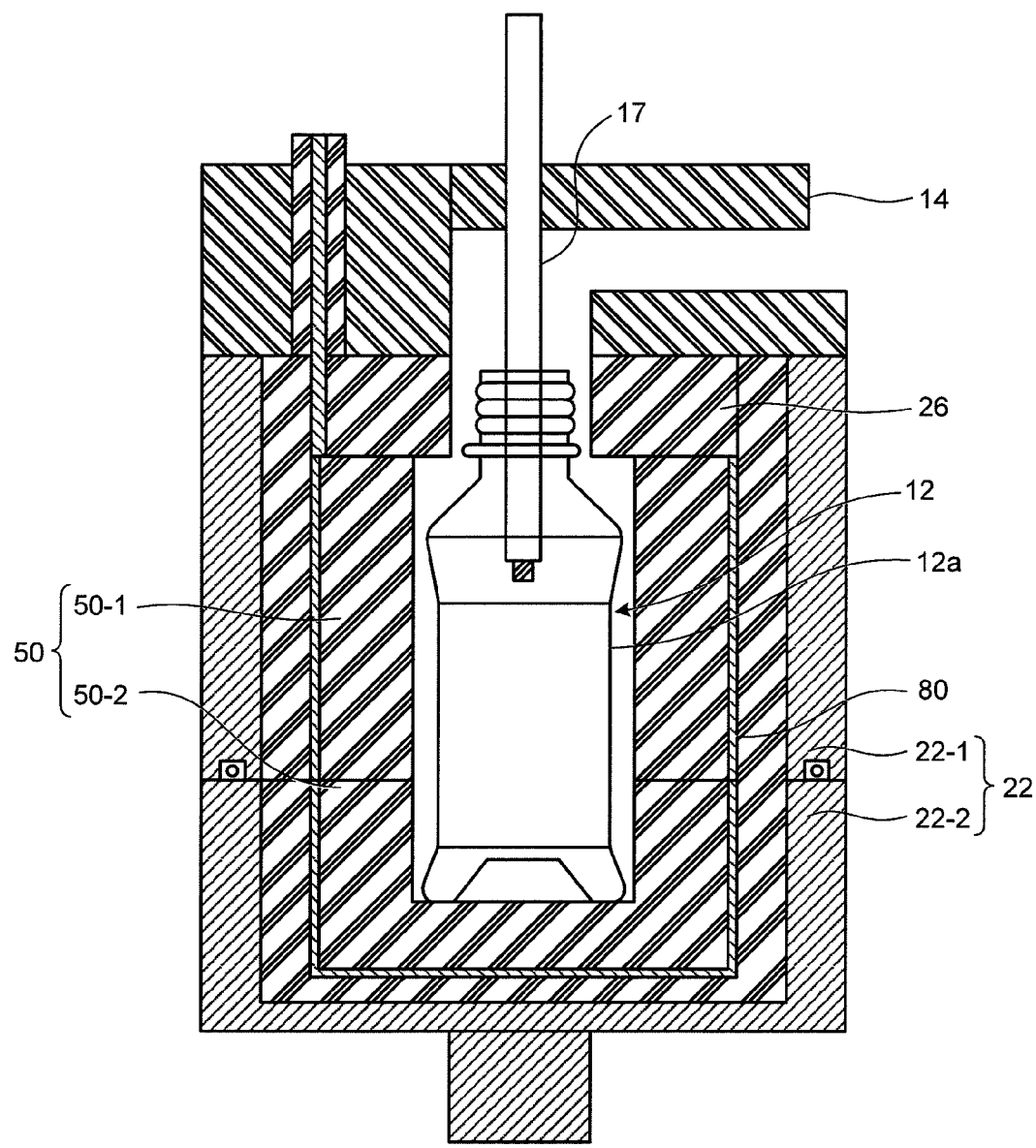
FIG. 24 is a schematic diagram of a barrier-film forming apparatus according to a ninth embodiment of the present invention.

FIG. 24 is a schematic diagram of a barrier-film forming apparatus according to still another embodiment of the present invention.

As shown in FIG. 24, the earth shield 22 as an external earth shield forms a vacuum chamber. A dielectric member is embedded between the earth shield 22 and the metallic sheet 80 to reduce an empty space and improve the sealing property. The space can be left.

In the present embodiment, the special effects achieved in the eighth embodiment are further increased, and breakdown in the empty space can be suppressed.

When a metallic sheet is used for the earth shield like the external electrode 80, the reduction in weight and cost can be realized.

[Tenth Embodiment]

Figure 25:
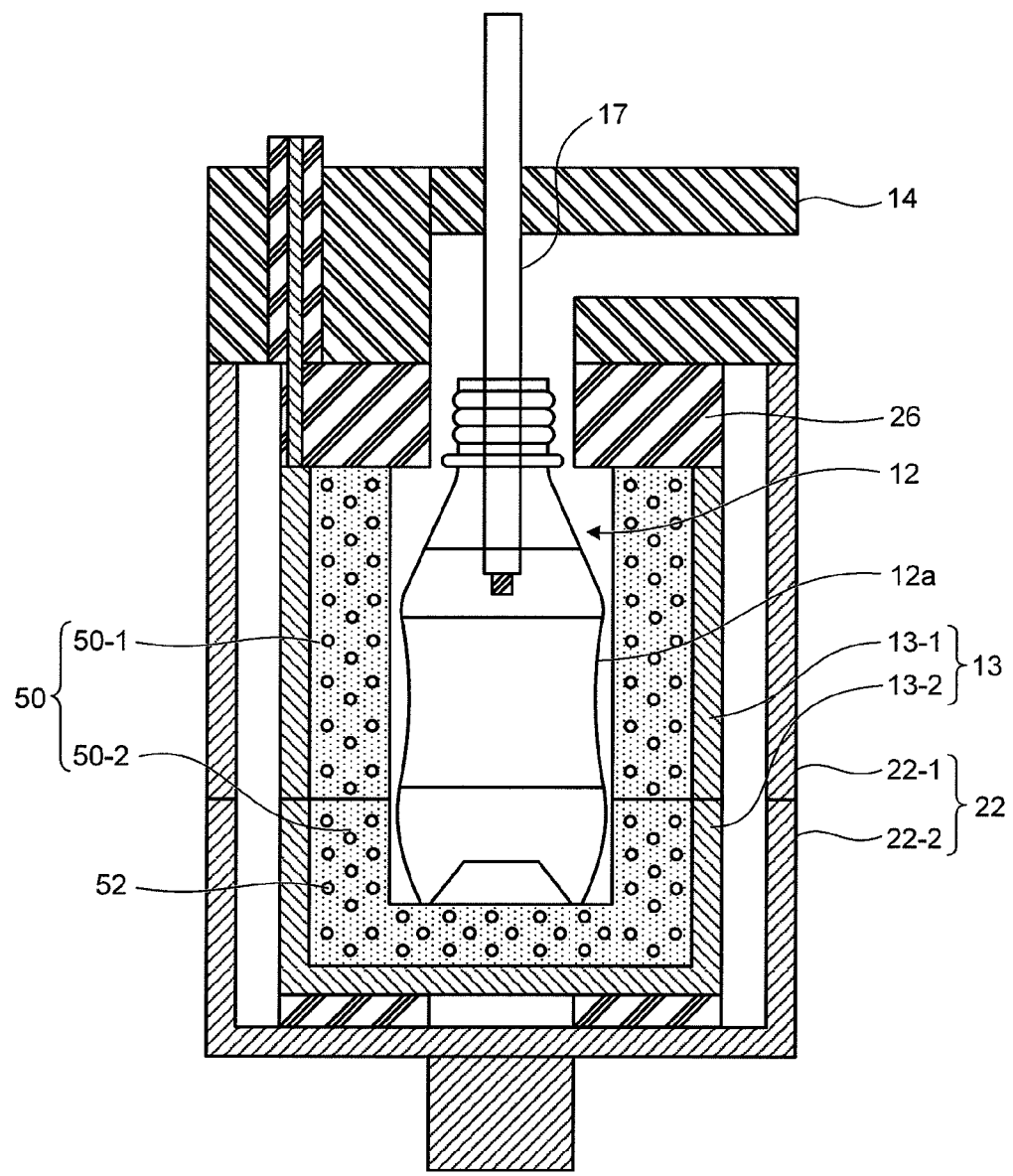
FIG. 25 is a schematic diagram of a barrier-film forming apparatus according to a tenth embodiment of the present invention.
Figure 26:
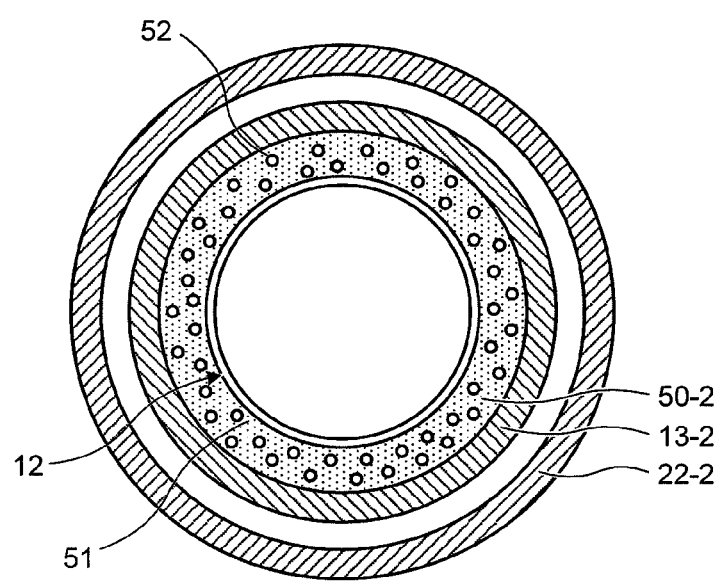
FIG. 26 is a cross-sectional view of relevant parts in FIG. 25.

FIG. 25 is a schematic diagram of a barrier-film forming apparatus according to still another embodiment of the present invention. FIG. 26 is a cross-sectional view of relevant parts in FIG. 25.

As shown in FIGS. 25 and 26, the dielectric member 50 in the present embodiment is made of foam having numerous voids 52. The presence of the voids 52 substantially reduces the relative permittivity $\in_D$, and reduces the ratio of the converted distances.

[Eleventh Embodiment]

Figure 27:
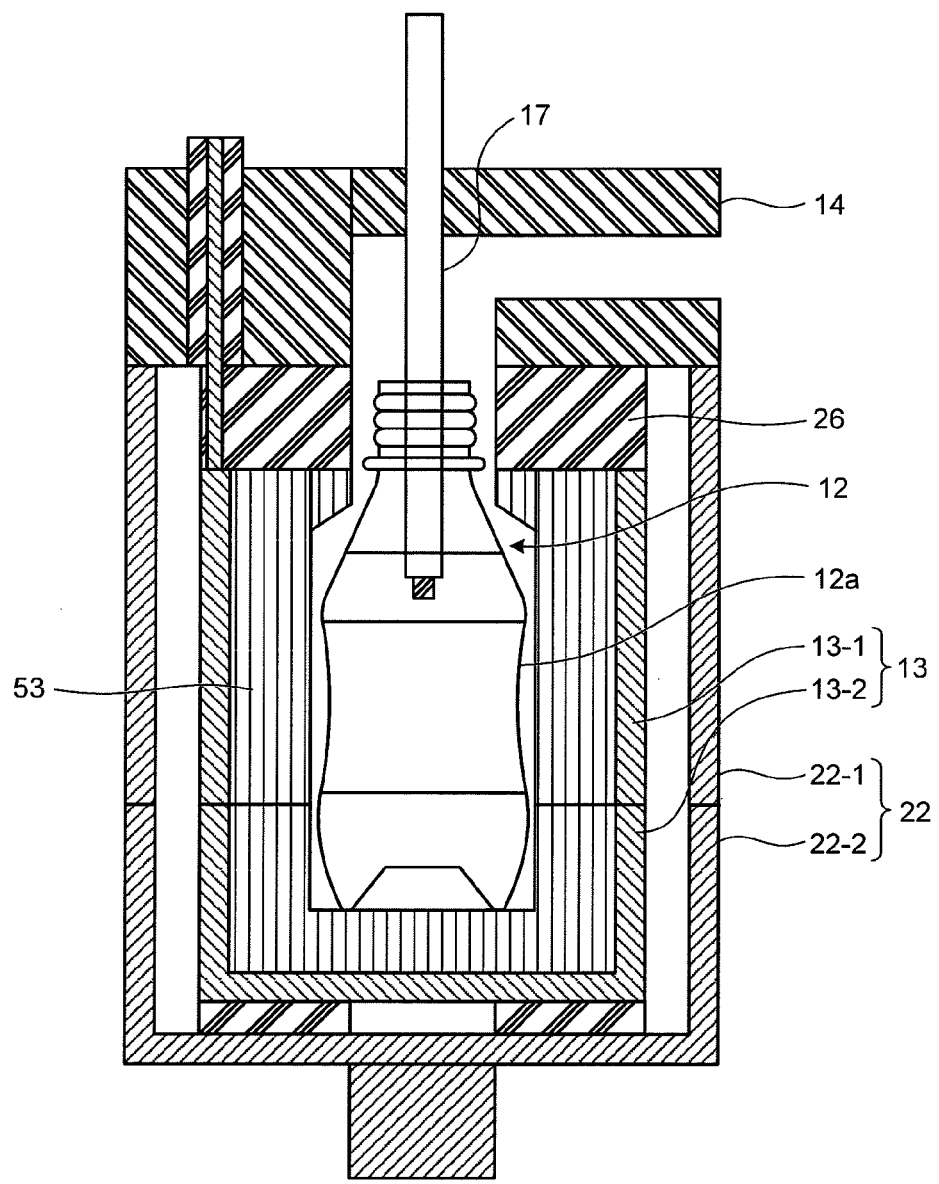
FIG. 27 is a schematic diagram of a barrier-film forming apparatus according to an eleventh embodiment of the present invention.
Figure 28:
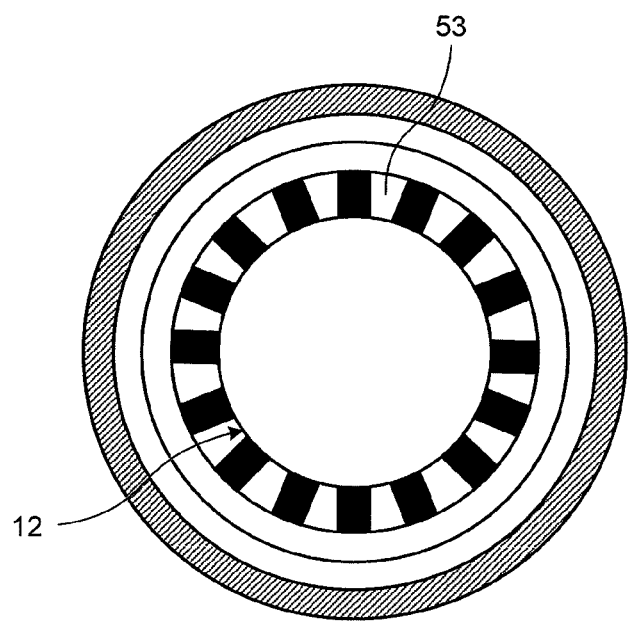
FIG. 28 is a cross-sectional view of relevant parts in FIG. 27.

FIG. 27 is a schematic diagram of a barrier-film forming apparatus according to still another embodiment of the present invention. FIG. 28 is a cross-sectional view of relevant parts in FIG. 27.

As show in FIGS. 27 and 28, a dielectric member having numerous slits 53 is installed in the present embodiment. The presence of the slits 53 substantially reduces the relative permittivity $\in_D$ and reduce the ratio of the converted distances.

[Twelfth Embodiment]

Figure 29:
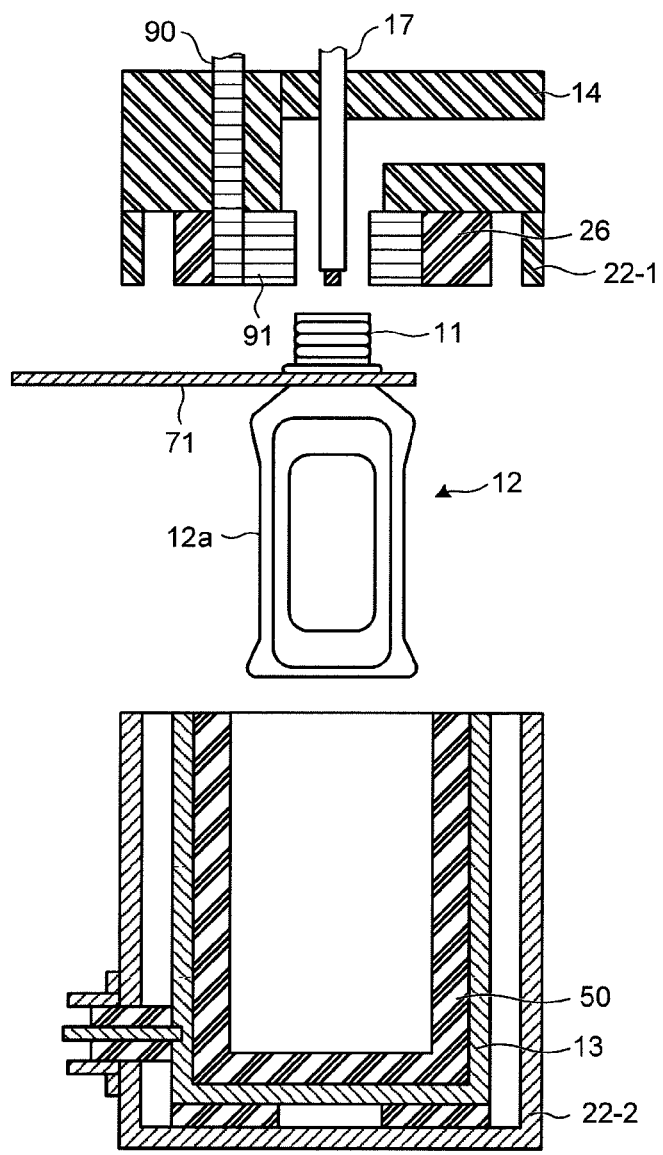
FIG. 29 is a process chart of forming a film on an inner face of a container using the barrier-film forming apparatus.
Figure 30:
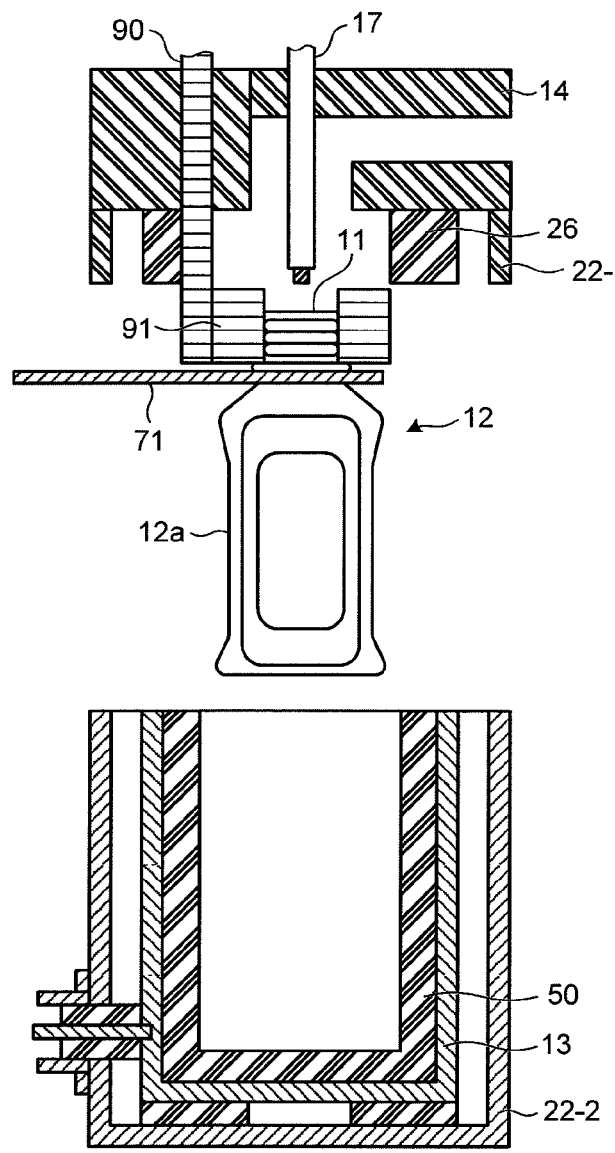
FIG. 30 is a process chart of forming a film on an inner face of a container using the barrier-film forming apparatus.
Figure 31:
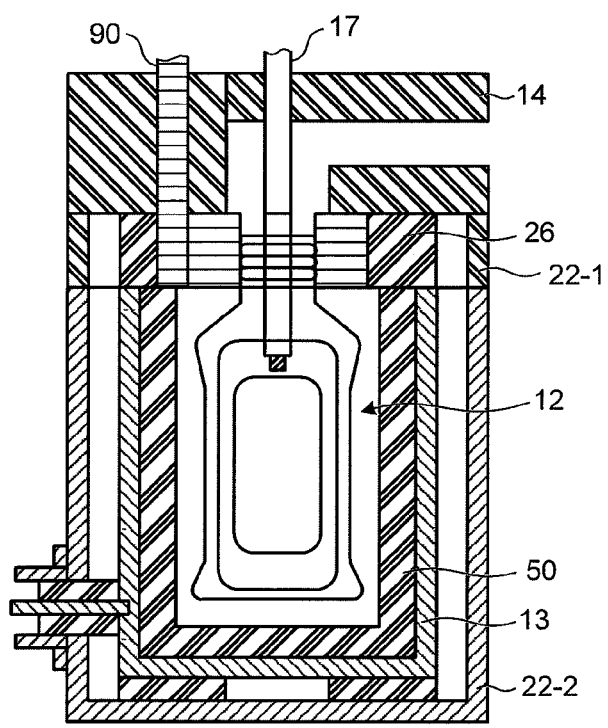
FIG. 31 is a process chart of forming a film on an inner face of a container using the barrier-film forming apparatus.

FIGS. 29 to 31 are schematic process charts of a barrier-film forming apparatus according to still another embodiment of the present invention.

As shown in FIG. 29, the dielectric member 50 having a sufficient space to assume the container 12 of various sizes is installed inside the external electrode 13, and the container 12 is inserted through the upper opening by means of the insertion jig 71.

As shown in FIG. 30, the mouth 11 of the container 12 is then held by a movable jig 90 that can move in the vertical axis direction from the side of the exhaust pipe 14, and a mouth holding jig 91 mounted on the tip of the movable jip 90, thereby fixing the container 12.

The external electrode including the dielectric member 50 and the earth shield 22 are then lifted to receive the container 12, as shown in FIG. 31.

According to the present embodiment, because the mouth 11 of the container 12 (particularly the PET bottle) generally has an approximately standardized shape, the container of any shape can be processed by one type handling device as long as the handling device performs neck handling to hold the mouth. Therefore, there is no need to change types of the holding jig for the body, which is required when the bottom of the container is inserted in the conventional techniques or in the above embodiments.

Accordingly, various containers can be installed in the barrier-film forming apparatus by a simple operation of neck handling when the containers can be inserted into the dielectric member 50. In addition, the presence of the dielectric member 50 enables to form a uniform film over the inner surface of the container.

In the present embodiment, by changing a part of the dielectric member of a tubular shape, for example at the mouth or the shoulder of the container, to a shape approximate (not completely similar) to the container shape, the dielectric member can have a shape that can accept various types of containers. The approximately tubular shape according to the present invention also includes such a shape.

[Thirteenth Embodiment]

Figure 32:
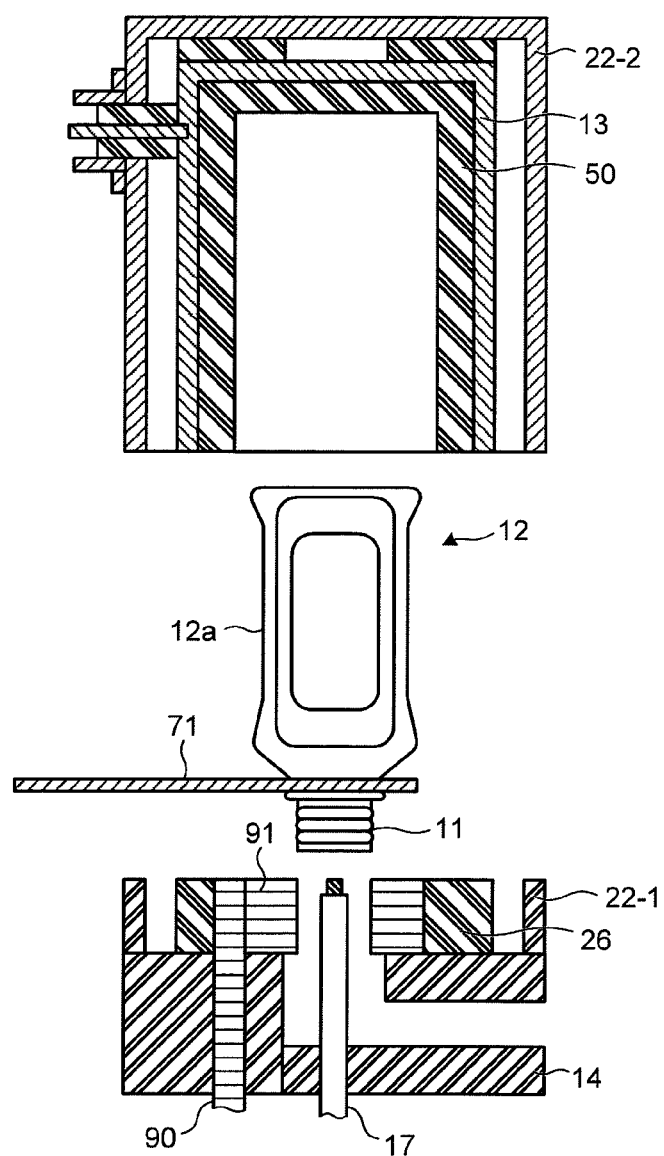
FIG. 32 is a process chart of forming a film on an inner face of a container using the barrier-film forming apparatus.
Figure 33:
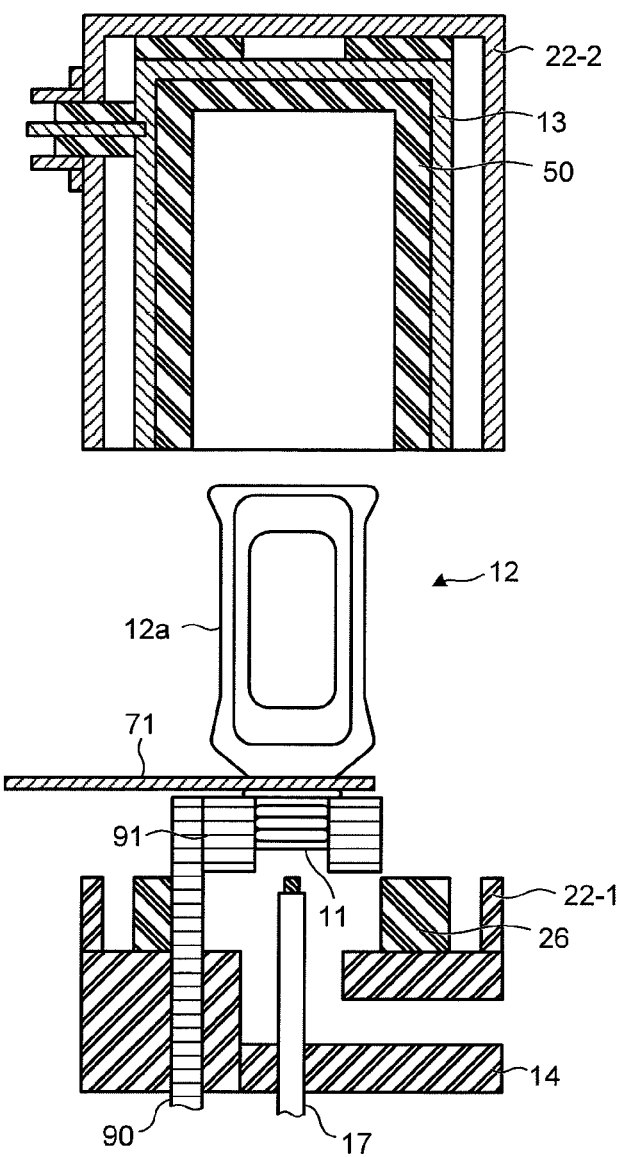
FIG. 33 is a process chart of forming a film on an inner face of a container using the barrier-film forming apparatus.
Figure 34:
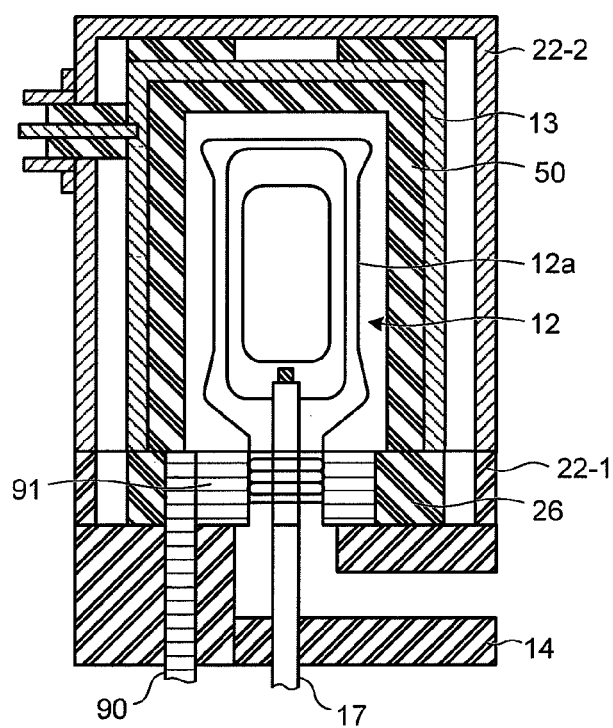
FIG. 34 is a process chart of forming a film on an inner face of a container using the barrier-film forming apparatus.

FIGS. 32 to 34 are schematic diagrams of a barrier-film forming apparatus according to still another embodiment of the present invention.

The barrier-film forming apparatus according to the present embodiment has a configuration obtained by vertically inverting the barrier-film forming apparatus as shown in FIGS. 29 to 31, and thus explanations of the process will be omitted. When the container 12 is oriented to have the mouth 11 point downward as in the present embodiment, it is possible to prevent carbon powder as a by-product generated in forming a carbon film from dropping in the container and being attached to the container. Accordingly, air cleaning of the container in the post process can be considerably simplified.

As described above, according to the present invention, the voltage applied to the inner face of the container can be made approximately uniform by using the dielectric member installed between the external electrode and the container, and the clearance between the external electrode and the container or the clearance between the dielectric member and the container inner face. Therefore, uniform film formation on the entire container can be achieved.

The barrier property can be relatively lower particularly in the case of a container to be filled with soft drink or the like, for example. Accordingly, by using one tubular electrode of a cylindrical shape, relatively satisfactory film can be formed on various types of containers without changing the type of the electrode. Therefore, in a film forming system that forms a film on a large quantity of containers, type change for film formation according to various containers is omitted, and thus system efficiency is greatly improved.

A higher barrier property is required for a container to be filled with beer, for example, and sharing of one tubular electrode of a cylindrical shape cannot achieve a sufficient barrier property. However, when $d/\in$ is uniformized over the entire container by properly selecting the dielectric member, the clearance thickness, or the relative permittivity $\in$ according to the present invention, satisfactory film formation can be achieved even for a container of a complicated shape with concaves and convexes, and thus a barrier property fifteen times higher can be easily obtained.

When a much higher barrier property is required, it is necessary to use a container without concave and convex. However, also in such cases, the present invention can suppress reduction in the barrier property due to the production accuracy, the molding accuracy, or the installation accuracy. Accordingly, a much higher barrier property (for example, twenty times higher) can be obtained.

At this time, because the film distribution becomes uniform, the same level of coloring is entirely obtained. Therefore, the problem occurring in the conventional techniques of forming a thick film to achieve a high barrier property, in which the b value is about 4 at a less colored portion while the b value is 7 to 8 at a more colored portion can be resolved.

Therefore, also in the case of a container to be filled with beer or the like and requiring high barrier, the b value can be suppressed to equal to or smaller than 4, and thus a container with a pleasing appearance can be obtained.

Because uniform film formation can be achieved, long film formation time is not required even when a high barrier property is needed unlike in the conventional technique, and generation of carbon powder dust can be suppressed correspondingly.

When the container has a concave or convex surface, uniformity in the film can be conventionally achieved only by the method of using the microwave, for example, and providing a low film quality and a low barrier property. However, according to the present invention, uniform film formation can be obtained by the film forming method using a high frequency and providing a high barrier property.

The present invention can achieve the above effects all together, and contributes to great improvement in the container coating technology.

As described above, according to the barrier-film forming apparatus and the barrier-film forming method of the present invention, uniform film formation can be achieved in the case in which the size of the clearance between the container and the external electrode becomes an issue, particularly for a container including a concave or convex surface. Accordingly, formation of a film with a higher barrier property than in the conventional techniques can be achieved at low cost.

The invention claimed is:

1. A barrier-film forming apparatus for forming a barrier film on an inner face of a container, the barrier-film forming apparatus comprising:
    an internal electrode provided with a gas flow channel through which medium gas is supplied to form the barrier film;
    an external electrode that is opened such that the internal electrode is inserted thereinto; and
    a dielectric member that is surrounded by the external electrode and configured to accommodate the container, the dielectric member having different relative permittivities ($\in_i$) with respect to a permittivity in a vacuum,
    wherein the barrier-film forming apparatus is configured to meet a predetermined condition, and
    wherein the predetermined condition is defined by a value obtained by dividing a standard deviation of a sum of converted distances ($d_i/\in_i$) at each point of the entire container by an average thereof, the converted distances ($d_i/\in_i$) being obtained by dividing a thickness ($d_i$) of the dielectric member or a design clearance ($d_i$) between the external electrode and the container or between the dielectric member and the inner face of the container by the different relative permittivities ($\in_i$) at each point of a surface of container from an inner surface of the external electrode to the inner face of the container, and the value is equal to or less than 0.75.

2. The barrier-film forming apparatus according to claim 1, wherein an internal shape of the external electrode is tubular or approximately tubular.

3. The barrier-film forming apparatus according to claim 1, further comprising
    a gas blowout unit configured to blow out medium gas so as to generate a barrier film into the container,
    wherein the gas blowout unit is grounded, and inserted into the container to serve as an internal electrode.

4. The barrier-film forming apparatus according to claim 1, wherein the barrier-film forming apparatus includes a cavity sized to enclose the processing target container, the cavity matching a space formed by a maximum path line on which the outer circumference of the container passes, or has a clearance outside the space formed by the maximum path line.

5. The barrier-film forming apparatus according to claim 1, wherein the dielectric member has a tubular shape having a bottom or a tubular shape substantially having a bottom.

6. The barrier-film forming apparatus according to claim 1, wherein the dielectric member has a bottomless tubular shape or a tubular shape having a portion of a bottom.

7. The barrier-film forming apparatus according to claim 1, wherein a part of the external electrode, which is arranged to face a space at a concave portion of the container, is covered with the dielectric member.

8. The barrier-film forming apparatus according to claim 1, wherein the dielectric layer forms a cavity, and a part of the cavity of the dielectric member, or approximately the entire of the cavity of the dielectric member is substantially in contact with the container.

9. The barrier-film forming apparatus according to claim 1, wherein the dielectric member is any one of fluorinated resin, hard vinyl chloride, glass, and ceramic, or a combination thereof.

10. The barrier-film forming apparatus according to claim 1, wherein the dielectric member is configured and arranged to form a clearance between a body of the container and the dielectric member when the container is placed inside of the dielectric member, the clearance between a body of the container and the dielectric member being sized so that a difference between a maximum value and a minimum value of a width of the clearance is equal to or larger than 3 millimeters.

11. The barrier-film forming apparatus according to claim 1, wherein the dielectric member has an approximately uniform thickness.

12. The barrier-film forming apparatus according to claim 1, wherein the dielectric member is configured to have a clearance at at least one of a shoulder and a mouth of the container.

13. The barrier-film forming apparatus according to claim 1, wherein
an electrode is connected with the electric-field applying unit.

14. The barrier-film forming apparatus according to claim 1, wherein a part of the dielectric member is configured so as to be capable of contacting the container, thereby positioning the container.

15. The barrier-film forming apparatus according to claim 1, wherein
a part of the dielectric member is configured so as to be capable of contacting the container, thereby positioning the container,
the part of the dielectric configured to contact the container has a movable structure; and
the movable structure is moved when the container is inserted or removed.

16. The barrier-film forming apparatus according to claim 1, further comprising
a conductive earth shield sized to enclose the external electrode and being grounded, the conductive earth shield being disposed so as to be insulated from the external electrode.

17. The barrier-film forming apparatus according to claim 1, wherein
the external electrode is a vacuum container.

18. The barrier-film forming apparatus according to claim 1, wherein
the dielectric member is a vacuum container.

19. The barrier-film forming apparatus according to claim 1, further comprising
a conductive earth shield sized to enclose the external electrode and being grounded, the conductive earth shield being disposed so as to be insulated from the external electrode, and
the earth shield being a vacuum container.

20. The barrier-film forming apparatus according to claim 1, wherein
the external electrode is a vacuum container, and
the external electrode is a sheet.

21. The barrier-film forming apparatus according to claim 1, wherein
a conductive earth shield sized to enclose the external electrode and being grounded, the conductive earth shield being disposed so as to be insulated from the external electrode, and an insulating member disposed substantially entirely between the external electrode and the earth shield.

22. The barrier-film forming apparatus according to claim 1, wherein the apparatus is sized and configured to retain the container as the processing target having an approximately tubular shape.

23. The barrier-film forming apparatus according to claim 1, wherein the apparatus is sized and configured to retain the container as the processing target having an approximately tubular shape and at least one concave portion.

24. A barrier-film forming apparatus for forming a barrier film on an inner face of a container, the barrier-film forming apparatus comprising:
an internal electrode provided with a gas flow channel through which medium gas is supplied to form the barrier film;
an external electrode that is opened such that the internal electrode is inserted thereinto; and
a dielectric member that is surrounded by the external electrode and configured to accommodate the container, the dielectric member having different relative permittivities ($\in_i$) with respect to a permittivity in a vacuum,
wherein the barrier-film forming apparatus is configured to meet a predetermined condition, and
wherein the predetermined condition is defined by a ratio Gmax/Gmin of a maximum value Gmax and a minimum value Gmin of converted distances, the converted distances being obtained by dividing a thickness ($d_i$) of the dielectric member or a design clearance ($d_i$) between the external electrode and the container or between the dielectric member and the inner face of the container by the different relative permittivities ($\in_i$) with respect to the minimum distance from the inner space of the container to the dielectric member or the external electrode, and the ratio Gmax/Gmin is equal to or lower than 11.

25. The barrier-film forming apparatus according to claim 24, wherein an internal shape of the external electrode is tubular or approximately tubular.

26. The barrier-film forming apparatus according to claim 24, further comprising
a gas blowout unit configured to blow out medium gas so as to generate a barrier film into the container,
wherein the gas blowout unit is grounded, and inserted into the container to serve as an internal electrode.

27. The barrier-film forming apparatus according to claim 24, wherein the barrier-film forming apparatus includes a cavity sized to enclose the processing target container, the cavity matching a space formed by a maximum path line on which the outer circumference of the container passes, or has a clearance outside the space formed by the maximum path line.

28. The barrier-film forming apparatus according to claim 24, wherein the dielectric member has a tubular shape having a bottom or a tubular shape substantially having a bottom.

29. The barrier-film forming apparatus according to claim 24, wherein the dielectric member has a bottomless tubular shape or a tubular shape having a portion of a bottom.

30. The barrier-film forming apparatus according to claim 24, wherein a part of the external electrode, which is arranged to face a space at a concave portion of the container, is covered with the dielectric member.

31. The barrier-film forming apparatus according to claim 24, wherein the dielectric layer forms a cavity, and a part of the cavity of the dielectric member, or approximately the entire of the cavity of the dielectric member is substantially in contact with the container.

32. The barrier-film forming apparatus according to claim 24, wherein the dielectric member is any one of fluorinated resin, hard vinyl chloride, glass, and ceramic, or a combination thereof.

33. The barrier-film forming apparatus according to claim 24, wherein the dielectric member is configured and arranged to form a clearance between a body of the container and the dielectric member when the container is placed inside of the dielectric member, the clearance between a body of the container and the dielectric member being sized so that a difference between a maximum value and a minimum value of a width of the clearance is equal to or larger than 3 millimeters.

34. The barrier-film forming apparatus according to claim 24, wherein the dielectric member has an approximately uniform thickness.

35. The barrier-film forming apparatus according to claim 24, wherein the dielectric member is configured to have a clearance at at least one of a shoulder and a mouth of the container.

36. The barrier-film forming apparatus according to claim 24, wherein
an electrode is connected with the electric-field applying unit.

37. The barrier-film forming apparatus according to claim 24, wherein a part of the dielectric member is configured so as to be capable of contacting the container, thereby positioning the container.

38. The barrier-film forming apparatus according to claim 24, wherein
a part of the dielectric member is configured so as to be capable of contacting the container, thereby positioning the container,
the part of the dielectric configured to contact the container has a movable structure; and
the movable structure is moved when the container is inserted or removed.

39. The barrier-film forming apparatus according to claim 24, further comprising
a conductive earth shield sized to enclose the external electrode and being grounded, the conductive earth shield being disposed so as to be insulated from the external electrode.

40. The barrier-film forming apparatus according to claim 24, wherein
the external electrode is a vacuum container.

41. The barrier-film forming apparatus according to claim 24, wherein
the dielectric member is a vacuum container.

42. The barrier-film forming apparatus according to claim 24, further comprising
a conductive earth shield sized to enclose the external electrode and being grounded, the conductive earth shield being disposed so as to be insulated from the external electrode, and
the earth shield being a vacuum container.

43. The barrier-film forming apparatus according to claim 24, wherein
the external electrode is a vacuum container, and
the external electrode is a sheet.

44. The barrier-film forming apparatus according to claim 24, wherein
a conductive earth shield sized to enclose the external electrode and being grounded, the conductive earth shield being disposed so as to be insulated from the external electrode, and an insulating member disposed substantially entirely between the external electrode and the earth shield.

45. The barrier-film forming apparatus according to claim 24, wherein the apparatus is sized and configured to retain the container as the processing target having an approximately tubular shape.

46. The barrier-film forming apparatus according to claim 24, wherein the apparatus is sized and configured to retain the container as the processing target having an approximately tubular shape and at least one concave portion.

47. A barrier-film forming apparatus for forming a barrier film on an inner face of a container, the barrier-film forming apparatus comprising:
an internal electrode provided with a gas flow channel through which medium gas is supplied to form the barrier film;
an external electrode that is opened such that the internal electrode is inserted thereinto; and
a dielectric member that is surrounded by the external electrode and configured to accommodate the container, the dielectric member having different relative permittivities ($\in_i$) with respect to a permittivity in a vacuum,
wherein barrier-film forming apparatus is configured to meet a predetermined condition, and
wherein the predetermined condition is defined by an average thickness of the dielectric member divided by the different relative permittivities ($\in_i$) having a range of 0.95 to 3.8.

48. The barrier-film forming apparatus according to claim 47, wherein an internal shape of the external electrode is tubular or approximately tubular.

49. The barrier-film forming apparatus according to claim 47, further comprising
a gas blowout unit configured to blow out medium gas so as to generate a barrier film into the container,
wherein the gas blowout unit is grounded, and inserted into the container to serve as an internal electrode.

50. The barrier-film forming apparatus according to claim 47, wherein the barrier-film forming apparatus includes a cavity sized to enclose the processing target container, the cavity matching a space formed by a maximum path line on which the outer circumference of the container passes, or has a clearance outside the space formed by the maximum path line.

51. The barrier-film forming apparatus according to claim 47, wherein the dielectric member has a tubular shape having a bottom or a tubular shape substantially having a bottom.

52. The barrier-film forming apparatus according to claim 47, wherein the dielectric member has a bottomless tubular shape or a tubular shape having a portion of a bottom.

53. The barrier-film forming apparatus according to claim 47, wherein a part of the external electrode, which is arranged to face a space at a concave portion of the container, is covered with the dielectric member.

54. The barrier-film forming apparatus according to claim 47, wherein the dielectric layer forms a cavity, and a part of the cavity of the dielectric member, or approximately the entire of the cavity of the dielectric member is substantially in contact with the container.

55. The barrier-film forming apparatus according to claim 47, wherein the dielectric member is any one of fluorinated resin, hard vinyl chloride, glass, and ceramic, or a combination thereof.

56. The barrier-film forming apparatus according to claim 47, wherein the dielectric member is configured and arranged to form a clearance between a body of the container and the dielectric member when the container is placed inside of the dielectric member, the clearance between a body of the container and the dielectric member being sized so that a difference between a maximum value and a minimum value of a width of the clearance is equal to or larger than 3 millimeters.

57. The barrier-film forming apparatus according to claim 47, wherein the dielectric member has an approximately uniform thickness.

58. The barrier-film forming apparatus according to claim 47, wherein the dielectric member is configured to have a clearance at at least one of a shoulder and a mouth of the container.

59. The barrier-film forming apparatus according to claim 47, wherein
an electrode is connected with the electric-field applying unit.

60. The barrier-film forming apparatus according to claim 47, wherein a part of the dielectric member is configured so as to be capable of contacting the container, thereby positioning the container.

61. The barrier-film forming apparatus according to claim 47, wherein
a part of the dielectric member is configured so as to be capable of contacting the container, thereby positioning the container,
the part of the dielectric configured to contact the container has a movable structure; and
the movable structure is moved when the container is inserted or removed.

62. The barrier-film forming apparatus according to claim 47, further comprising
a conductive earth shield sized to enclose the external electrode and being grounded, the conductive earth shield being disposed so as to be insulated from the external electrode.

63. The barrier-film forming apparatus according to claim 47, wherein
the external electrode is a vacuum container.

64. The barrier-film forming apparatus according to claim 47, wherein
the dielectric member is a vacuum container.

65. The barrier-film forming apparatus according to claim 47, further comprising
a conductive earth shield sized to enclose the external electrode and being grounded, the conductive earth shield being disposed so as to be insulated from the external electrode, and
the earth shield being a vacuum container.

66. The barrier-film forming apparatus according to claim 47, wherein
the external electrode is a vacuum container, and
the external electrode is a sheet.

67. The barrier-film forming apparatus according to claim 47, wherein
a conductive earth shield sized to enclose the external electrode and being grounded, the conductive earth shield being disposed so as to be insulated from the external electrode, and an insulating member disposed substantially entirely between the external electrode and the earth shield.

68. The barrier-film forming apparatus according to claim 47, wherein the apparatus is sized and configured to retain the container as the processing target having an approximately tubular shape.

69. The barrier-film forming apparatus according to claim 47, wherein the apparatus is sized and configured to retain the container as the processing target having an approximately tubular shape and at least one concave portion.

* * * * *

UNITED STATES PATENT AND TRADEMARK OFFICE
CERTIFICATE OF CORRECTION

PATENT NO. : 8,950,356 B2
APPLICATION NO. : 12/524784
DATED : February 10, 2015
INVENTOR(S) : Yuji Asahara et al.

Page 1 of 1

It is certified that error appears in the above-identified patent and that said Letters Patent is hereby corrected as shown below:

On the title page item (73) Assignees, please change "MITSUBISHI HEAVY INDUSTRIES FOOD & MACHINERY CO., LTD." to --MITSUBISHI HEAVY INDUSTRIES FOOD & PACKAGING MACHINERY CO., LTD.--.

Signed and Sealed this
Eighth Day of March, 2016

Michelle K. Lee
*Director of the United States Patent and Trademark Office*